(12) United States Patent
Drogi et al.

(10) Patent No.: US 11,476,815 B2
(45) Date of Patent: Oct. 18, 2022

(54) ENVELOPE TRACKING SYSTEMS FOR POWER AMPLIFIERS

(71) Applicant: Skyworks Solutions, Inc., Irvine, CA (US)

(72) Inventors: Serge Francois Drogi, Flagstaff, CA (US); Florinel G. Balteanu, Irvine, CA (US); David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/138,286

(22) Filed: Dec. 30, 2020

(65) Prior Publication Data

US 2021/0119592 A1   Apr. 22, 2021

Related U.S. Application Data

(63) Continuation of application No. 16/811,299, filed on Mar. 6, 2020.

(60) Provisional application No. 62/819,177, filed on Mar. 15, 2019, provisional application No. 62/831,324, filed on Apr. 9, 2019.

(51) Int. Cl.
*H03F 3/24* (2006.01)
*H04W 52/52* (2009.01)
*H04B 1/40* (2015.01)

(52) U.S. Cl.
CPC .............. *H03F 3/245* (2013.01); *H04B 1/40* (2013.01); *H04W 52/52* (2013.01); *H03F 2200/105* (2013.01); *H03F 2200/451* (2013.01)

(58) Field of Classification Search
CPC ....................................................... H03F 3/245
See application file for complete search history.

(56) References Cited

U.S. PATENT DOCUMENTS

| 6,438,365 B1 | 8/2002 | Balteanu |
| 6,704,560 B1 | 3/2004 | Balteanu et al. |
| 6,977,976 B1 | 12/2005 | Birkett et al. |
| 7,058,373 B2 | 6/2006 | Grigore |
| 7,496,339 B2 | 2/2009 | Balteanu et al. |

(Continued)

OTHER PUBLICATIONS

Diaz et al., "Three-Level Cell Topology for a Multilevel Power Supply to Achieve high . Efficienty Envelope Amplifier," IEEE Transactions on Circuits and Systems—I: Regular Papers, vol. 59, No. 9, Sep. 2012, in 14 pages.

(Continued)

*Primary Examiner* — Patricia T Nguyen
(74) *Attorney, Agent, or Firm* — Knobbe, Martens, Olson & Bear, LLP

(57) ABSTRACT

Envelope tracking systems for power amplifiers are provided herein. In certain embodiments, an envelope tracker is provided for a power amplifier that amplifies an RF signal. The envelope tracker includes an error amplifier that controls a voltage level of a power amplifier supply voltage of the power amplifier based on amplifying a difference between a reference signal and an envelope signal indicating an envelope of the RF signal. The envelope tracker further includes a multi-level switching circuit that generates an error amplifier supply voltage based on sensing a current of the error amplifier, and uses the error amplifier supply voltage to power the error amplifier.

20 Claims, 22 Drawing Sheets

(56) References Cited

U.S. PATENT DOCUMENTS

| | | | |
|---|---|---|---|
| 8,140,028 B2 | 3/2012 | Balteanu et al. | |
| 8,351,873 B2 | 1/2013 | Balteanu et al. | |
| 8,718,188 B2 | 5/2014 | Balteanu et al. | |
| 8,786,371 B2 | 7/2014 | Popplewell et al. | |
| 8,981,847 B2 | 3/2015 | Balteanu | |
| 9,083,455 B2 | 7/2015 | Popplewell et al. | |
| 9,092,393 B2 | 7/2015 | Whitefield et al. | |
| 9,118,277 B2 | 8/2015 | Balteanu et al. | |
| 9,143,096 B2 | 9/2015 | Balteanu et al. | |
| 9,189,430 B2 | 11/2015 | Ross et al. | |
| 9,197,128 B2 | 11/2015 | Popplewell et al. | |
| 9,294,054 B2 | 3/2016 | Balteanu et al. | |
| 9,356,512 B2 | 5/2016 | Chowdhury et al. | |
| 9,391,648 B2 | 7/2016 | Popplewell et al. | |
| 9,425,833 B2 | 8/2016 | Popplewell et al. | |
| 9,445,371 B2 | 9/2016 | Khesbak et al. | |
| 9,584,070 B2 | 2/2017 | Balteanu et al. | |
| 9,588,529 B2 | 3/2017 | Balteanu et al. | |
| 9,606,947 B2 | 3/2017 | Ross et al. | |
| 9,668,215 B2 | 5/2017 | Balteanu et al. | |
| 9,673,707 B2 | 6/2017 | Popplewell et al. | |
| 9,698,832 B2 | 7/2017 | Popplewell et al. | |
| 9,774,300 B2 | 9/2017 | Jin et al. | |
| 9,806,676 B2 | 10/2017 | Balteanu et al. | |
| 9,831,765 B2 * | 11/2017 | Liu | H03K 7/06 |
| 9,831,834 B2 | 11/2017 | Balteanu et al. | |
| 9,876,473 B2 | 1/2018 | Khesbak et al. | |
| 9,893,682 B2 | 2/2018 | Zhu et al. | |
| 9,935,582 B2 | 4/2018 | Balteanu et al. | |
| 9,948,241 B2 | 4/2018 | Popplewell et al. | |
| 9,971,377 B2 | 5/2018 | Balteanu et al. | |
| 9,973,088 B2 | 5/2018 | Balteanu et al. | |
| 9,990,322 B2 | 6/2018 | Whitefield et al. | |
| 9,991,856 B2 | 6/2018 | Khesbak et al. | |
| 2013/0043944 A1 * | 2/2013 | Jones | H03F 1/0261 330/124 R |
| 2014/0218109 A1 * | 8/2014 | Wimpenny | H03F 1/0277 330/251 |
| 2014/0312970 A1 | 10/2014 | Nagasaku et al. | |
| 2014/0327483 A1 * | 11/2014 | Balteanu | H03F 3/68 330/295 |
| 2014/0361837 A1 | 12/2014 | Strange et al. | |
| 2015/0137886 A1 | 5/2015 | Tanio | |
| 2015/0155836 A1 | 6/2015 | Midya et al. | |
| 2015/0214898 A1 | 7/2015 | Fagg | |
| 2016/0056714 A1 | 2/2016 | Ek | |
| 2016/0094186 A1 | 3/2016 | Cohen | |
| 2016/0254746 A1 * | 9/2016 | Lerdworatawee | H02M 3/158 323/271 |
| 2017/0131734 A1 | 5/2017 | Balteanu et al. | |
| 2017/0195972 A1 | 7/2017 | Drogi et al. | |
| 2017/0223632 A1 | 8/2017 | Balteanu et al. | |
| 2017/0228332 A1 | 8/2017 | Ross et al. | |
| 2017/0338773 A1 | 11/2017 | Balteanu et al. | |
| 2018/0076772 A1 | 3/2018 | Khesbak et al. | |
| 2018/0138862 A1 | 5/2018 | Balteanu et al. | |
| 2018/0152144 A1 | 5/2018 | Choo et al. | |
| 2018/0152945 A1 | 5/2018 | Balteanu | |
| 2018/0159476 A1 | 6/2018 | Balteanu et al. | |
| 2018/0159478 A1 | 6/2018 | Balteanu et al. | |
| 2018/0167037 A1 | 6/2018 | Zhu et al. | |
| 2018/0234095 A1 | 8/2018 | Balteanu et al. | |
| 2018/0278214 A1 | 9/2018 | Jin et al. | |
| 2018/0287573 A1 | 10/2018 | Khesbak et al. | |
| 2018/0294776 A1 | 10/2018 | Popplewell et al. | |
| 2018/0302036 A1 | 10/2018 | Balteanu et al. | |
| 2018/0331659 A1 | 11/2018 | Khesbak et al. | |
| 2018/0351454 A1 | 12/2018 | Khesbak et al. | |
| 2018/0375476 A1 | 12/2018 | Balteanu et al. | |
| 2018/0375483 A1 | 12/2018 | Balteanu et al. | |
| 2019/0020315 A1 | 1/2019 | Khesbak et al. | |
| 2019/0123690 A1 | 4/2019 | Balteanu et al. | |
| 2019/0158046 A1 | 5/2019 | Lehtola et al. | |
| 2019/0165736 A1 | 5/2019 | Khesbak et al. | |
| 2019/0190462 A1 | 6/2019 | Zhu et al. | |
| 2019/0229621 A1 | 7/2019 | Balteanu et al. | |
| 2019/0341888 A1 | 11/2019 | Drogi et al. | |
| 2019/0372526 A1 | 12/2019 | Balteanu et al. | |
| 2019/0372628 A1 | 12/2019 | Balteanu et al. | |
| 2019/0386617 A1 | 12/2019 | Naraine et al. | |
| 2020/0067406 A1 | 2/2020 | Khesbak et al. | |
| 2020/0099343 A1 | 3/2020 | Khesbak et al. | |
| 2020/0112300 A1 | 4/2020 | Balteanu et al. | |
| 2020/0127619 A1 | 4/2020 | Khesbak et al. | |
| 2020/0154434 A1 | 5/2020 | Balteanu | |
| 2020/0162028 A1 | 5/2020 | Balteanu et al. | |
| 2020/0162030 A1 | 5/2020 | Drogi et al. | |
| 2020/0259458 A1 | 8/2020 | Balteanu et al. | |
| 2020/0259459 A1 | 8/2020 | Balteanu et al. | |
| 2020/0295713 A1 * | 9/2020 | Khlat | H03F 1/025 |
| 2020/0336110 A1 | 10/2020 | Drogi et al. | |
| 2020/0336122 A1 | 10/2020 | Lin et al. | |
| 2020/0343865 A1 | 10/2020 | Balteanu et al. | |
| 2020/0350878 A1 | 11/2020 | Drogi et al. | |
| 2021/0083576 A1 | 3/2021 | Bansal et al. | |

OTHER PUBLICATIONS

Florian et al., "Envelope tracking of an RF High Power Amplifier with an 8-Level Digitally Controlled GaN-on-Si Supply Modulator," IEEE Transactions on Microwave Theory and Techniques, vol. 63, No. 8, Aug. 2015, in 14 pages.

Garcia et al., "Comparison of Two Multilevel Architectures for Envelope Amplifier," Universidad Politecnica de Madrid, Centro de Electrónica Industrial, 2009, in 7 pages.

Huang et al., "A MASH-Controlled Multilevel Power Converter for high-Efficiency RF Transmitters," IEEE Transactions on Power Electronics, vol. 26, No. 4, Apr. 2011, in 10 pages.

Kashani et al., "Digital Multi-Level Closed Loop Design for Wideband Envelope Tracking Systems," 2016 ICSEE International Conference on the Science of Electrical Engineering, 2016, in 5 pages.

Kim et al., "Envelope Amplifier with Multiple-Linear Regulator for Envelope Trackng Power Amplifier," IEEE Transactions on Microwave Theory and Techniques, vol. 61, No. 11, Nov. 2013, in 10 pages.

Xi et al., "Feed-Forward Scheme Considering Bandwidth Limitation of Operational Amplifiers for Envelope Tracking Power Supply Using Series-Connected Composite Configuration," IEEE Transactions on Industrial Electronics, vol. 60, No. 9, Sep. 2013, in 12 pages.

* cited by examiner

ENVELOPE TRACKING SYSTEMS FOR POWER AMPLIFIERS

CROSS-REFERENCE TO RELATED APPLICATIONS

This application is a continuation of U.S. patent application Ser. No. 16/811,299, filed Mar. 6, 2020, titled "ENVELOPE TRACKING SYSTEMS FOR POWER AMPLIFIERS", which claims the benefit of priority under 35 U.S.C. § 119 of U.S. Provisional Patent Application No. 62/831,324, filed Apr. 9, 2019 and titled "ENVELOPE TRACKING SYSTEMS FOR POWER AMPLIFIERS," and of U.S. Provisional Patent Application No. 62/819,177, filed Mar. 15, 2019 and titled "ENVELOPE TRACKING SYSTEMS FOR POWER AMPLIFIERS," each of which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for fifth generation (5G) communications in Frequency Range 1 (FR1).

SUMMARY

In certain embodiments, the present disclosure relates to a mobile device. The mobile device includes a transceiver configured to generate a radio frequency transmit signal, a front end circuit including a power amplifier configured to amplify the radio frequency transmit signal, and a power management circuit including an envelope tracker configured to generate a power amplifier supply voltage of the power amplifier. The envelope tracker includes an error amplifier configured to control a voltage level of the power amplifier supply voltage based on amplifying a difference between a reference signal and an envelope signal indicating an envelope of the radio frequency transmit signal. Additionally, the envelope tracker includes a multi-level switching circuit configured to control a voltage level of an error amplifier supply voltage of the error amplifier based on sensing a current of the error amplifier.

In various embodiments, the error amplifier includes an output stage powered by the error amplifier supply voltage. According to some embodiments, the error amplifier further includes an input stage powered by a fixed supply voltage. In accordance with a number of embodiments, the error amplifier further includes an input stage configured to provide a sense current to the multi-level switching circuit.

In several embodiments, the error amplifier is implemented as a current feedback amplifier.

In some embodiments, the multi-level switching circuit includes a control circuit configured to compare the sensed current of the error amplifier to a plurality of current thresholds of different levels. According to a number of embodiments, the control circuit includes a hysteretic current comparator.

In various embodiments, the multi-level switching circuit includes a multi-level supply DC-to-DC converter configured to generate a plurality of regulated voltages of different voltage levels, a modulator configured to receive the plurality of regulated voltages and to output the error amplifier supply voltage, and a control circuit configured to control the modulator based on the sensed current. According to several embodiments, the modulator includes a plurality of switches each electrically connected between a corresponding one of the plurality of regulated voltages and the error amplifier supply voltage.

In a number of embodiments, the envelope tracker further includes a DC-to-DC converter configured to generate a regulated voltage, and an AC combiner configured to combine the regulated voltage and an output current of the error amplifier to generate the power amplifier supply voltage. According to various embodiments, the envelope tracker further includes a current source connected to an input of the error amplifier and a tracking circuit connected to the combiner and configured to control a current of the current source.

In some embodiments, the error amplifier includes a first input configured to receive the reference signal, a second input configured to receive the envelope signal, an amplification circuit biased by a control signal, and an input current reduction circuit configured to adjust the control signal via feedback so as to reduce an input current to the second input. According to several embodiments, the input current reduction circuit includes a first voltage divider electrically connected between the output and the second input and operable to control the second input. In accordance with a number of embodiments, the input current reduction circuit includes a second voltage divider connected between the output and the second input and operable to provide a second divided voltage, and a control amplifier configured to generate the control signal based on a voltage difference between the first divided voltage and the second divided voltage. According to various embodiments, the input impedance of the second input is at least ten times lower than the input impedance of the first input. In accordance with several embodiments, the first input connects to a transistor gate, and the second input connects to at least one of a transistor source or a transistor drain. According to a number of embodiments, the first input connects to a differential input buffer and the second input does not connect to any differential input buffer.

In various embodiments, the mobile device further includes a controllable bandwidth adjustment capacitor electrically connected to the power amplifier supply voltage.

In a number of embodiments, the mobile device further includes a battery operable to provide a battery voltage to the multi-level switching circuit.

In several embodiments, the mobile device further includes an antenna configured to radiate a transmit wave in response to receiving an amplified radio frequency transmit signal from the power amplifier.

In certain embodiments, the present disclosure relates to an envelope tracking system. The envelope tracking system includes a power amplifier configured to amplify a radio frequency transmit signal, and an envelope tracker configured to generate a power amplifier supply voltage of the power amplifier. The envelope tracker includes an error amplifier configured to control a voltage level of the power amplifier supply voltage based on amplifying a difference between a reference signal and an envelope signal indicating an envelope of the radio frequency transmit signal. The envelope tracker further includes a multi-level switching circuit configured to control a voltage level of an error amplifier supply voltage of the error amplifier based on sensing a current of the error amplifier.

In some embodiments, the error amplifier includes an output stage powered by the error amplifier supply voltage. According to various embodiments, the error amplifier further includes an input stage powered by a fixed supply voltage. In accordance with a number of embodiments, the error amplifier further includes an input stage configured to provide a sense current to the multi-level switching circuit.

In several embodiments, the error amplifier is implemented as a current feedback amplifier.

In various embodiments, the multi-level switching circuit includes a control circuit configured to compare the sensed current of the error amplifier to a plurality of current thresholds of different levels. In accordance with a number of embodiments, the control circuit includes a hysteretic current comparator.

In some embodiments, the multi-level switching circuit includes a multi-level supply DC-to-DC converter configured to generate a plurality of regulated voltages of different voltage levels, a modulator configured to receive the plurality of regulated voltages and to output the error amplifier supply voltage, and a control circuit configured to control the modulator based on the sensed current. According to various embodiments, the modulator includes a plurality of switches each electrically connected between a corresponding one of the plurality of regulated voltages and the error amplifier supply voltage.

In several embodiments, the envelope tracker further includes a DC-to-DC converter configured to generate a regulated voltage, and an AC combiner configured to combine the regulated voltage and an output current of the error amplifier to generate the power amplifier supply voltage. According to some embodiments, the envelope tracker further includes a current source connected to an input of the error amplifier and a tracking circuit connected to the combiner and configured to control a current of the current source.

In various embodiments, the error amplifier includes a first input configured to receive the reference signal, a second input configured to receive the envelope signal, an amplification circuit biased by a control signal, and an input current reduction circuit configured to adjust the control signal via feedback so as to reduce an input current to the second input. According to several embodiments, the input current reduction circuit includes a first voltage divider electrically connected between the output and the second input and operable to control the second input. In accordance with a number of embodiments, the input current reduction circuit includes a second voltage divider connected between the output and the second input and operable to provide a second divided voltage, and a control amplifier configured to generate the control signal based on a voltage difference between the first divided voltage and the second divided voltage. According to some embodiments, the input impedance of the second input is at least ten times lower than the input impedance of the first input. In accordance with several embodiments, the first input connects to a transistor gate, and the second input connects to at least one of a transistor source or a transistor drain. According to a number of embodiments, the first input connects to a differential input buffer and the second input does not connect to any differential input buffer.

In some embodiments, the envelope tracking system is implemented on a packaged module.

In certain embodiments, the present disclosure relates to a method of envelope tracking. The method includes amplifying a radio frequency transmit signal using a power amplifier, controlling a voltage level of a power amplifier supply voltage of the power amplifier based on amplifying a difference between a reference signal and an envelope signal using an error amplifier, the envelope signal indicating an envelope of the radio frequency transmit signal, sensing a current of the error amplifier, and controlling a voltage level of an error amplifier supply voltage of the error amplifier based on the sensed current using a multi-level switching circuit.

In some embodiments, the method further includes supplying power to an output stage of the error amplifier using the error amplifier supply voltage. According to various embodiments, the method further includes power to an input stage of the error amplifier using a fixed supply voltage. In accordance with a number of embodiments, sensing the current of the error amplifier includes providing a sense current to the multi-level switching circuit using an input stage of the error amplifier.

In various embodiments, the error amplifier is implemented as a current feedback amplifier.

In a number of embodiments, the method further includes comparing the sensed current of the error amplifier to a plurality of current thresholds of different levels. According to several embodiments, the method further includes using hysteresis when comparing the sensed current to the plurality of current thresholds.

In some embodiments, controlling the voltage level of the error amplifier supply voltage includes generating a plurality of regulated voltages of different voltage levels, and performing modulation based on the plurality of regulated voltages and the sensed current.

In various embodiments, the method further includes generating a regulated voltage using a DC-to-DC converter, and combining the regulated voltage and an output current of the error amplifier to generate the power amplifier supply voltage.

In a number of embodiments, the method further includes radiating a transmit wave from an antenna in response to receiving an amplified radio frequency transmit signal from the power amplifier.

In certain embodiments, the present disclosure relates to an envelope tracker. The envelope tracker includes an error amplifier configured to control a voltage level of a power amplifier supply voltage based on amplifying a difference between a reference signal and an envelope signal indicating an envelope of a radio frequency transmit signal, and a multi-level switching circuit configured to control a voltage level of an error amplifier supply voltage of the error amplifier based on sensing a current of the error amplifier.

In various embodiments, the error amplifier includes an output stage powered by the error amplifier supply voltage. According to several embodiments, the error amplifier further includes an input stage powered by a fixed supply voltage. In accordance with a number of embodiments, the error amplifier further includes an input stage configured to provide a sense current to the multi-level switching circuit.

In some embodiments, the error amplifier is implemented as a current feedback amplifier.

In a number of embodiments, the envelope tracker further includes a controllable bandwidth adjustment capacitor electrically connected to the power amplifier supply voltage.

In several embodiments, the multi-level switching circuit includes a control circuit configured to compare the sensed current of the error amplifier to a plurality of current thresholds of different levels. According to a number of embodiments, the control circuit includes a hysteretic current comparator.

In some embodiments, the multi-level switching circuit includes a multi-level supply DC-to-DC converter configured to generate a plurality of regulated voltages of different voltage levels, a modulator configured to receive the plurality of regulated voltages and to output the error amplifier supply voltage, and a control circuit configured to control the modulator based on the sensed current. According to several embodiments, the modulator includes a plurality of switches each electrically connected between a corresponding one of the plurality of regulated voltages and the error amplifier supply voltage.

In various embodiments, the envelope tracker further includes an AC combiner configured to combine a DC voltage and an output current of the error amplifier to generate the power amplifier supply voltage. According to several embodiments, the envelope tracker further includes a current source connected to an input of the error amplifier and a tracking circuit connected to the combiner and configured to control a current of the current source. In accordance with a number of embodiments, the envelope tracker further includes a DC-to-DC converter configured to generate the DC voltage. According to some embodiments, the multi-level switching circuit is configured to generate the DC voltage.

In several embodiments, the error amplifier includes a first input configured to receive the reference signal, a second input configured to receive the envelope signal, an amplification circuit biased by a control signal, and an input current reduction circuit configured to adjust the control signal via feedback so as to reduce an input current to the second input. In accordance with some embodiments, the input current reduction circuit includes a first voltage divider electrically connected between the output and the second input and operable to control the second input. According to various embodiments, the input current reduction circuit includes a second voltage divider connected between the output and the second input and operable to provide a second divided voltage, and a control amplifier configured to generate the control signal based on a voltage difference between the first divided voltage and the second divided voltage. In accordance with a number of embodiments, the input impedance of the second input is at least ten times lower than the input impedance of the first input. According to some embodiments, the first input connects to a transistor gate, and the second input connects to at least one of a transistor source or a transistor drain. In accordance with various embodiments, the first input connects to a differential input buffer and the second input does not connect to any differential input buffer.

In a number of embodiments, the envelope tracker is implemented on a packaged module.

In certain embodiments, the present disclosure relates to an envelope tracking system. The envelope tracking system includes a first power amplifier configured to amplify a first radio frequency signal, a second power amplifier configured to amplify a second radio frequency signal, and an envelope tracker configured to generate a first power amplifier supply voltage of the first power amplifier and a second power amplifier supply voltage of the second power amplifier. The envelope tracker includes a first error amplifier configured to generate a first output current that adjusts the first power amplifier supply voltage, a second error amplifier configured to output a second output current that adjusts the second power amplifier supply voltage, and a multi-level switching circuit configured to control a first error amplifier supply voltage of the first error amplifier based on a first sense signal from the first error amplifier and to control a second error amplifier supply voltage of the second error amplifier based on a second sense signal from the second error amplifier.

In some embodiments, the first error amplifier includes an output stage powered by the first error amplifier supply voltage. According to several embodiments, the first error amplifier further includes an input stage powered by a fixed supply voltage. In accordance with a number of embodiments, the first error amplifier further includes an input stage configured to output a first sense current corresponding to the first sense signal. According to various embodiments, the multi-level switching circuit includes a control circuit configured to compare the first sense current to a plurality of current thresholds of different levels. In accordance with several embodiments, the control circuit includes a hysteretic current comparator.

In various embodiments, the first error amplifier is implemented as a current feedback amplifier.

In some embodiments, the multi-level switching circuit includes a multi-level supply DC-to-DC converter configured to generate a plurality of regulated voltages of different voltage levels, a first modulator configured to receive the plurality of regulated voltages and to output the first error amplifier supply voltage, and a second modulator configured to receive the plurality of regulated voltages and to output the second error amplifier supply voltage. According to several embodiments, the first modulator includes a plurality of switches each electrically connected between a corresponding one of the plurality of regulated voltages and the first error amplifier supply voltage. In accordance with a number of embodiments, the multi-level switching circuit further includes a first control circuit configured to control the first modulator based on the first sense signal, and a second control circuit configured to control the second modulator based on the second sense signal. According to various embodiments, the envelope tracker further includes a first combiner configured to generate the first power amplifier supply voltage based on combining a first DC voltage and the first output current. In accordance with several embodiments, the multi-level supply DC-to-DC converter is configured to generate the first DC voltage.

In several embodiments, the envelope tracker further includes a first combiner configured to generate the first power amplifier supply voltage based on combining a first DC voltage and the first output current. According to various embodiments, the envelope tracker further includes a DC-to-DC converter configured to generate the first DC voltage. In accordance with a number of embodiments, the envelope tracker further includes a second combiner configured to generate the second power amplifier supply voltage based on combining a second DC voltage and the second output current. Accordance with some embodiments, the envelope tracker further includes a multi-output DC-to-DC converter configured to generate the first DC voltage and the second DC voltage. In accordance with various embodiments, the multi-output DC-to-DC converter generates two or more output voltages, the envelope tracker further including a selecting circuit configured to select which of the two or more output voltages serves as the first DC voltage and which of the two or more output voltages serves as the second DC voltage. According to a number of embodiments, the envelope tracker further includes a first DC-to-DC converter configured to generate the first DC voltage and a second DC-to-DC converter configured to generate the second DC voltage.

In various embodiments, the envelope tracking system further includes a third power amplifier powered by a third power amplifier supply voltage, the envelope tracker further including a third error amplifier configured to output a third output current that adjusts the third power amplifier supply voltage, and the multi-level switching circuit is further configured to control a third error amplifier supply voltage of the third error amplifier based on a third sense signal from the third error amplifier.

In several embodiments, the multi-level switching circuit includes a switched capacitor DC-to-DC converter configured to generate a plurality of regulated voltages of different voltage levels, a first modulator configured to receive the plurality of regulated voltages and to output the first error amplifier supply voltage, and a second modulator configured to receive the plurality of regulated voltages and to output the second error amplifier supply voltage.

In some embodiments, the first error amplifier is configured to amplify a difference between a reference signal and a first envelope signal indicating an envelope of the first radio frequency signal. According to a number of embodiments, the second error amplifier is configured to amplify a difference between the reference signal and a second envelope signal indicating an envelope of the second radio frequency signal.

In several embodiments, the envelope tracker further includes a comparator configured to process the first sense signal and the second sense signal to generate a comparison signal for the multi-level switching circuit.

In various embodiments, the envelope tracker further includes a controllable bandwidth adjustment capacitor electrically connected to the first power amplifier supply voltage.

In a number of embodiments, the envelope tracking system is implemented on a packaged module.

In certain embodiments, the present disclosure relates to a method of envelope tracking. The method includes amplifying a first radio frequency signal using a first power amplifier, amplifying a second radio frequency using a second power amplifier, adjusting a first power amplifier supply voltage of the first power amplifier using a first error amplifier, controlling a first error amplifier supply voltage of the first error amplifier based on a first sense signal from the first error amplifier using a multi-level switching circuit, adjusting a second power amplifier supply voltage of the second power amplifier using a second error amplifier, and controlling a second error amplifier supply voltage of the second error amplifier based on a second sense signal from the second error amplifier using the multi-level switching circuit.

In several embodiments, the method further includes powering an output stage of the first error amplifier with the first error amplifier supply voltage. According to various embodiments, the method further includes powering an input stage of the first error amplifier using a fixed supply voltage. In accordance with a number of embodiments, the method further includes generating a first sense current corresponding to the first sense signal using an input stage of the first error amplifier. According to some embodiments, the method further includes controlling the multi-level switching circuit based on comparing the first sense current to a plurality of current thresholds of different levels.

In various embodiments, controlling the first error amplifier supply voltage includes generating a plurality of regulated voltages of different voltage levels and modulating the plurality of regulated voltages based on the first sense signal. According to a number of embodiments, controlling the second error amplifier supply voltage includes modulating the plurality of regulated voltages based on the second sense signal.

In several embodiments, adjusting the first power amplifier supply voltage includes combining a first DC voltage and an output current of the first error amplifier using a first combiner. According to various embodiments, the method further includes generating the first DC voltage using a DC-to-DC converter. In accordance with a number of embodiments, adjusting the second power amplifier supply voltage includes combining a second DC voltage and an output current of the second error amplifier using a second combiner. According to some embodiments, the method further includes generating the first DC voltage and the second DC voltage using a multi-output DC-to-DC converter. In accordance with various embodiments, the method further includes generating two or more output voltages using the multi-output DC-to-DC converter, and selecting which of the two or more output voltages serves as the first DC voltage and which of the two or more output voltages serves as the second DC voltage using a selecting circuit. According to a number of embodiments, the method further includes generating the first DC voltage using a first DC-to-DC converter and generating the second DC voltage using a second DC-to-DC converter.

In some embodiments, the method further includes amplifying a third radio frequency signal using a third power amplifier, adjusting a third power amplifier supply voltage of the third power amplifier using a third error amplifier, and controlling a third error amplifier supply voltage of the third error amplifier based on a third sense signal from the third error amplifier using the multi-level switching circuit.

In various embodiments, adjusting the first power amplifier supply voltage includes amplifying a difference between a reference signal and a first envelope signal indicating an envelope of the first radio frequency signal. According to a number of embodiments, adjusting the first power amplifier supply voltage includes amplifying a difference between the reference signal and a second envelope signal indicating an envelope of the second radio frequency signal.

In several embodiments, the method further includes adjusting a modulation bandwidth of envelope tracking using a controllable bandwidth adjustment capacitor electrically connected to the first power amplifier supply voltage.

In a number of embodiments, the method further includes providing a battery voltage to the multi-level switching circuit.

In various embodiments, the method further includes transmitting an amplified radio frequency signal from the first power amplifier on an antenna.

In certain embodiments, the present disclosure relates to a mobile device. The mobile device includes a transceiver configured to generate a first radio frequency signal and a second radio frequency signal, a front end circuit including a first power amplifier configured to amplify the first radio frequency signal and a second power amplifier configured to amplify the second radio frequency signal, and a power management circuit including an envelope tracker configured to generate a first power amplifier supply voltage of the first power amplifier and a second power amplifier supply voltage of the second power amplifier. The envelope tracker includes a first error amplifier configured to generate a first output current that adjusts the first power amplifier supply voltage, a second error amplifier configured to output a second output current that adjusts the second power amplifier supply voltage, and a multi-level switching circuit configured to control a first error amplifier supply voltage of the first error amplifier based on a first sense signal from the first error amplifier and to control a second error amplifier supply voltage of the second error amplifier based on a second sense signal from the second error amplifier.

In some embodiments, the first error amplifier includes an output stage powered by the first error amplifier supply voltage. According to several embodiments, the first error amplifier further includes an input stage powered by a fixed supply voltage. In accordance with a number of embodiments, the first error amplifier further includes an input stage configured to output a first sense current corresponding to the first sense signal. According to various embodiments, the multi-level switching circuit includes a control circuit configured to compare the first sense current to a plurality of current thresholds of different levels. In accordance with several embodiments, the control circuit includes a hysteretic current comparator.

In various embodiments, the first error amplifier is implemented as a current feedback amplifier.

In several embodiments, the multi-level switching circuit includes a multi-level supply DC-to-DC converter configured to generate a plurality of regulated voltages of different voltage levels, a first modulator configured to receive the plurality of regulated voltages and to output the first error amplifier supply voltage, and a second modulator configured to receive the plurality of regulated voltages and to output the second error amplifier supply voltage. According to various embodiments, the first modulator includes a plurality of switches each electrically connected between a corresponding one of the plurality of regulated voltages and the first error amplifier supply voltage. In accordance with a number of embodiments, the multi-level switching circuit further includes a first control circuit configured to control the first modulator based on the first sense signal, and a second control circuit configured to control the second modulator based on the second sense signal. According to some embodiments, the envelope tracker further includes a first combiner configured to generate the first power amplifier supply voltage based on combining a first DC voltage and the first output current. In accordance with various embodiments, the multi-level supply DC-to-DC converter is configured to generate the first DC voltage.

In some embodiments, the envelope tracker further includes a first combiner configured to generate the first power amplifier supply voltage based on combining a first DC voltage and the first output current. According to several embodiments, the envelope tracker further includes a DC-to-DC converter configured to generate the first DC voltage. In accordance with a number of embodiments, the envelope tracker further includes a second combiner configured to generate the second power amplifier supply voltage based on combining a second DC voltage and the second output current. According to various embodiments, the envelope tracker further includes a multi-output DC-to-DC converter configured to generate the first DC voltage and the second DC voltage. In accordance with several embodiments, the multi-output DC-to-DC converter generates two or more output voltages, and the envelope tracker further includes a selecting circuit configured to select which of the two or more output voltages serves as the first DC voltage and which of the two or more output voltages serves as the second DC voltage. According to a number of embodiments, the envelope tracker further includes a first DC-to-DC converter configured to generate the first DC voltage and a second DC-to-DC converter configured to generate the second DC voltage.

In several embodiments, the front end circuit further includes a third power amplifier powered by a third power amplifier supply voltage from the envelope tracker, the envelope tracker further includes a third error amplifier configured to output a third output current that adjusts the third power amplifier supply voltage, and the multi-level switching circuit is further configured to control a third error amplifier supply voltage of the third error amplifier based on a third sense signal from the third error amplifier.

In a number of embodiments, the multi-level switching circuit includes a switched capacitor DC-to-DC converter configured to generate a plurality of regulated voltages of different voltage levels, a first modulator configured to receive the plurality of regulated voltages and to output the first error amplifier supply voltage, and a second modulator configured to receive the plurality of regulated voltages and to output the second error amplifier supply voltage.

In various embodiments, the first error amplifier is configured to amplify a difference between a reference signal and a first envelope signal indicating an envelope of the first radio frequency signal. According to several embodiments, the second error amplifier is configured to amplify a difference between the reference signal and a second envelope signal indicating an envelope of the second radio frequency signal.

In some embodiments, the envelope tracker further includes a comparator configured to process the first sense signal and the second sense signal to generate a comparison signal for the multi-level switching circuit.

In a number of embodiments, the envelope tracker further includes a controllable bandwidth adjustment capacitor electrically connected to the first power amplifier supply voltage.

In several embodiments, the mobile device further includes a battery operable to provide a battery voltage to the multi-level switching circuit.

In various embodiments, the mobile device further includes an antenna configured to radiate a transmit wave in response to receiving an amplified radio frequency signal from the first power amplifier.

DETAILED DESCRIPTION OF EMBODIMENTS

Figure 1:
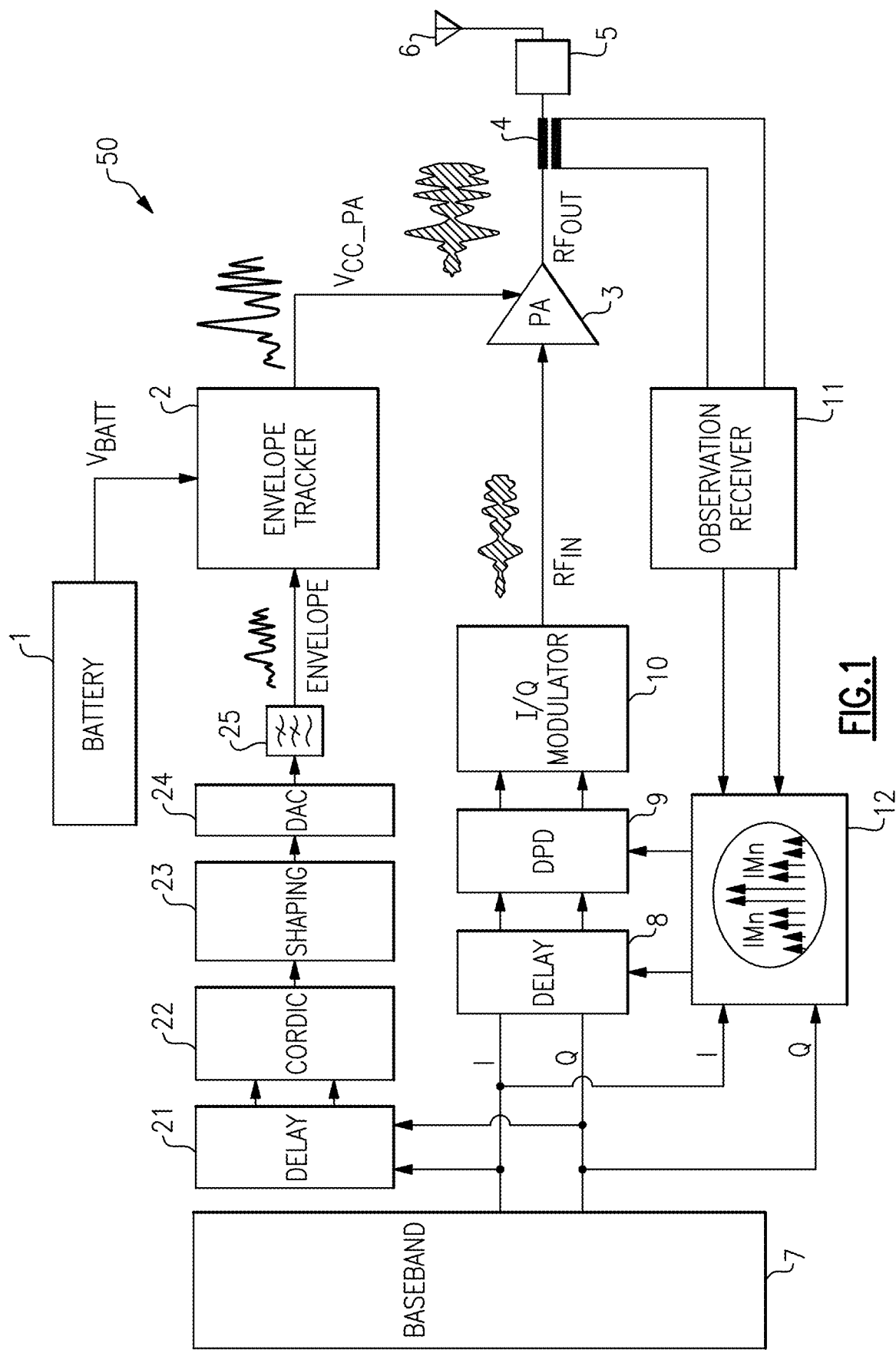
FIG. 1 is a schematic diagram of one embodiment of a communication system for transmitting radio frequency (RF) signals.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Envelope tracking is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier is increased. Likewise, when the envelope of the RF signal decreases, the voltage supplied to the power amplifier is decreased to reduce power consumption.

Envelope tracking systems for power amplifiers are provided herein. In certain embodiments, an envelope tracker is provided for a power amplifier that amplifies an RF signal. The envelope tracker includes an error amplifier that controls a voltage level of a power amplifier supply voltage of the power amplifier based on amplifying a difference between a reference signal and an envelope signal indicating an envelope of the RF signal. The envelope tracker further includes a multi-level switching circuit that generates an error amplifier supply voltage based on sensing a current of the error amplifier, and uses the error amplifier supply voltage to power the error amplifier.

Accordingly, the multi-level switching circuit is used to generate a supply voltage of the error amplifier, and to modulate the error amplifier's supply voltage based on the sensed current of the error amplifier. For example, in response to detecting that the amount of current provided by the error amplifier has increased, the multi-level switching circuit can be implemented to increase the error amplifier's supply voltage.

In certain implementations, the error amplifier includes two or more stages, and at least an output stage of the error amplifier is powered by the error amplifier supply voltage. In certain implementations, one or more stages of the error amplifier operate using a different supply voltage than the error amplifier supply voltage controlled by the multi-level switching circuit. For example, an input stage of the error amplifier can be controlled with a fixed supply voltage. In certain implementations, the current from the error amplifier's input stage is used to generate a sense current that is provided to the multi-level switching circuit.

The multi-level switching circuit can be implemented in a wide variety of ways. In certain implementations, the multi-level switching circuit includes a multi-level supply (MLS) DC-to-DC converter that generates multiple regulated voltages of different voltage levels based on a battery voltage, an MLS modulator including a bank of switches each connected between a corresponding regulated voltage and the error amplifier supply voltage, and a control circuit that processes the sensed current to open or close particular switches of the bank to thereby generate the error amplifier supply voltage.

In certain implementations, the multi-level switching circuit's control circuit includes a hysteretic current comparator for processing the sensed current from the error amplifier. For example, the sensed current can be compared to a plurality of current thresholds to thereby generate switch control signals for individually activating the switches of the MLS modulator.

The error amplifier can control the supply voltage of the power amplifier in a wide variety of ways. In certain implementations, the envelope tracker includes an AC combiner that combines a DC voltage with an output current from the error amplifier to thereby generate the power amplifier supply voltage. In certain implementations, the DC voltage is regulated. For instance, the DC voltage can correspond to a regulated voltage from the MLS DC-to-DC converter of the multi-level switching circuit or a regulated voltage from a separate DC-to-DC converter.

In certain implementations, circuitry of the envelope tracker is shared in part to generate power amplifier supply voltages for two or more power amplifiers. For example, the envelope tracker can include a common or shared multi-level switching circuit that generates a first error amplifier supply voltage for a first error amplifier and a second error amplifier supply voltage for a second error amplifier. Additionally, the envelope tracker further includes a first AC combiner that combines a first DC voltage with an output current from the first error amplifier to generate a first power amplifier supply voltage for a first power amplifier, and a second AC combiner that combines a second DC voltage with an output current from the second error amplifier to generate a second power amplifier supply voltage for a second power amplifier.

Sharing envelope tracker circuitry can be advantageous in a number of applications, including, but not limited to, uplink carrier aggregation and/or dual connectivity (EN-DC) scenarios for 5G.

In certain implementations, a first input of the error amplifier receives the reference signal and a second input of the error amplifier receives the envelope signal, and the second input has lower input impedance than the first input to provide a rapid transient response and high envelope tracking bandwidth. For example, the second input can source or sink a relatively large current to quickly charge or discharge internal capacitances of the error amplifier to provide a fast transient response. The second input can have lower input impedance than the first input at least over a frequency range of the envelope signal. In contrast, when an envelope tracker's amplifier includes a pair of inputs with high input impedance, a resistor-capacitor (RC) time constant associated with charging or discharging capacitances can be relatively large, which leads to a degradation of the envelope tracker's bandwidth.

In certain implementations, the error amplifier includes an input current reduction circuit for dynamically adjusting a control signal of the error amplifier to reduce an amount of input current flowing into or out of the second input. For example, in certain implementations the input current reduction circuit controls a voltage level of a control voltage of the error amplifier's input stage to a bias point associated with low input current and fast envelope tracking.

Accordingly, an input current reduction circuit can dynamically bias the error amplifier to provide wide envelope tracking bandwidth, for instance, 180 MHz or more of modulation bandwidth. Such wide bandwidth can provide a number of advantages, including, but not limited to, sufficient bandwidth for wideband 5G signals.

FIG. 1 is a schematic diagram of one embodiment of a communication system 50 for transmitting RF signals. The communication system 50 includes a battery 1, an envelope tracker 2, a power amplifier 3, a directional coupler 4, a duplexing and switching circuit 5, an antenna 6, a baseband processor 7, a signal delay circuit 8, a digital pre-distortion (DPD) circuit 9, an I/Q modulator 10, an observation receiver 11, an intermodulation detection circuit 12, an envelope delay circuit 21, a coordinate rotation digital computation (CORDIC) circuit 22, a shaping circuit 23, a digital-to-analog converter 24, and a reconstruction filter 25.

The communication system 50 of FIG. 1 illustrates one example of an RF system that can include an envelope tracking system implemented in accordance with one or more features of the present disclosure. However, the teachings herein are applicable to RF systems implemented in a wide variety of ways.

The baseband processor 7 operates to generate an in-phase (I) signal and a quadrature-phase (Q) signal, which correspond to signal components of a sinusoidal wave or signal of a desired amplitude, frequency, and phase. For example, the I signal and the Q signal provide an equivalent representation of the sinusoidal wave. In certain implementations, the I and Q signals are outputted in a digital format. The baseband processor 7 can be any suitable processor for processing baseband signals. For instance, the baseband processor 7 can include a digital signal processor, a microprocessor, a programmable core, or any combination thereof.

The signal delay circuit 8 provides adjustable delay to the I and Q signals to aid in controlling relative alignment between the envelope signal provided to the envelope tracker 2 and the RF signal $RF_{IN}$ provide to the power amplifier 3. The amount of delay provided by the signal delay circuit 8 is controlled based on amount of intermodulation in adjacent bands detected by the intermodulation detection circuit 12.

The DPD circuit 9 operates to provide digital shaping to the delayed I and Q signals from the signal delay circuit 8 to generate digitally pre-distorted I and Q signals. In the illustrated embodiment, the digital shaping provided by the DPD circuit 9 is controlled based on amount of intermodulation detected by the intermodulation detection circuit 12. The DPD circuit 9 serves to reduce a distortion of the power amplifier 3 and/or to increase the efficiency of the power amplifier 3.

The I/Q modulator 10 receives the digitally pre-distorted I and Q signals, which are processed to generate the RF signal $RF_{IN}$. For example, the I/Q modulator 10 can include DACs configured to convert the digitally pre-distorted I and Q signals into an analog format, mixers for upconverting the analog I and Q signals to radio frequency, and a signal combiner for combining the upconverted I and Q signals into the RF signal $RF_{IN}$. In certain implementations, the I/Q modulator 10 can include one or more filters configured to filter frequency content of signals processed therein.

The envelope delay circuit 21 delays the I and Q signals from the baseband processor 7. Additionally, the CORDIC circuit 22 processes the delayed I and Q signals to generate a digital envelope signal corresponding to a digital representation of an envelope of the RF signal $RF_{IN}$. Although FIG. 1 illustrates an implementation using the CORDIC circuit 22, an envelope signal can be obtained in other ways.

The shaping circuit 23 operates to shape the digital envelope signal to enhance the performance of the communication system 50. In certain implementations, the shaping circuit 23 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24 to an analog envelope signal. Additionally, the analog envelope signal is filtered by the reconstruction filter 25 to generate an envelope signal suitable for use by the envelope tracker 2. In certain implementations, the reconstruction filter 25 includes a low pass filter.

With continuing reference to FIG. 1, the envelope tracker 2 receives the envelope signal from the reconstruction filter

25 and a battery voltage $V_{BATT}$ from the battery 1, and uses the envelope signal to generate a power amplifier supply voltage $V_{CC\_PA}$ for the power amplifier 3 that changes in relation to the envelope of the RF signal $RF_{IN}$. The envelope tracker 2 can be implemented in accordance with any of the embodiments herein.

The power amplifier 3 receives the RF signal $RF_{IN}$ from the I/Q modulator 10, and provides an amplified RF signal $RF_{OUT}$ to the antenna 6 through the duplexing and switching circuit 5, in this example.

The directional coupler 4 is positioned between the output of the power amplifier 3 and the input of the duplexing and switching circuit 5, thereby allowing a measurement of output power of the power amplifier 3 that does not include insertion loss of the duplexing and switching circuit 5. The sensed output signal from the directional coupler 4 is provided to the observation receiver 11, which can include mixers for providing down conversion to generate downconverted I and Q signals, and DACs for generating I and Q observation signals from the downconverted I and Q signals.

The intermodulation detection circuit 12 determines an intermodulation product between the I and Q observation signals and the I and Q signals from the baseband processor 7. Additionally, the intermodulation detection circuit 12 controls the DPD provided by the DPD circuit 9 and/or a delay of the signal delay circuit 8 to control relative alignment between the envelope signal and the RF signal $RF_{IN}$. In another embodiment, the intermodulation detection circuit 12 additionally or alternatively controls a delay of the signal delay circuit 21.

By including a feedback path from the output of the power amplifier 3 and baseband, the I and Q signals can be dynamically adjusted to optimize the operation of the communication system 50. For example, configuring the communication system 50 in this manner can aid in providing power control, compensating for transmitter impairments, and/or in performing DPD.

Although illustrated as a single stage, the power amplifier 3 can include multiple stages. Furthermore, the teachings herein are applicable to communication systems including multiple power amplifiers.

FIGS. 2A-3C are schematic diagram of various embodiments of envelope tracking systems for a power amplifier. Although various embodiments of envelope tracking systems are depicted, the teachings herein are applicable to envelope trackers implemented in a wide variety of ways. Accordingly, other implementations are possible.

Figure 2A:
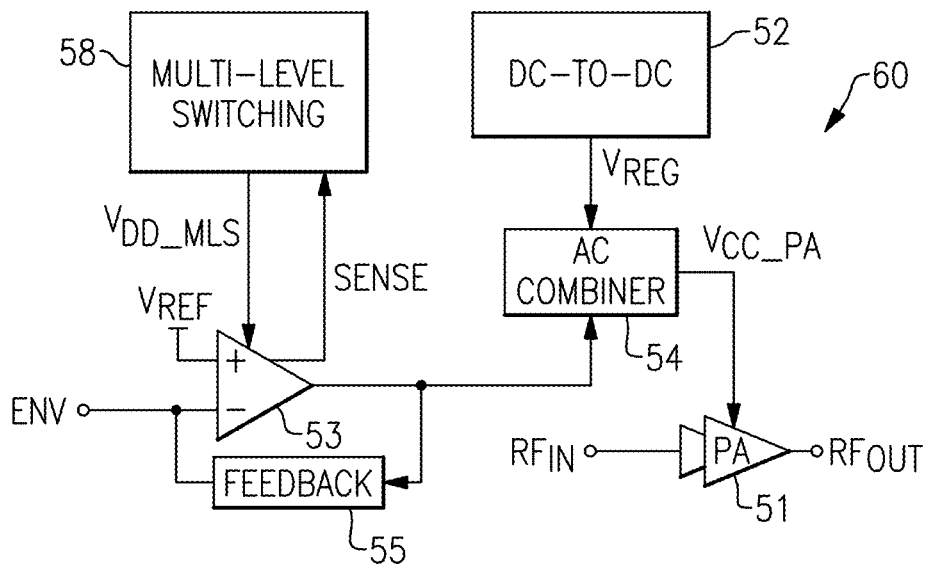
FIG. 2A is a schematic diagram of one embodiment of an envelope tracking system for a power amplifier.

FIG. 2A is a schematic diagram of one embodiment of an envelope tracking system 60 for a power amplifier 51. The envelope tracking system 60 includes a DC-to-DC converter 52, an error amplifier 53, an AC combiner 54, a feedback circuit 55, and a multi-level switching circuit 58.

As shown in FIG. 2A, the multi-level switching circuit 58 receives a sense signal SENSE from the error amplifier 53, which the multi-level switching circuit 58 processes to generate an error amplifier supply voltage $V_{DD\_MLS}$ for powering the error amplifier 53. In certain implementations, the sense signal SENSE serves to track changes in the envelope signal ENV. For example, the sense signal SENSE can change in relation to a current of the error amplifier 53, such as an output current of the error amplifier 53 and/or an internal current (for instance, an inter-stage current) of the error amplifier 53.

The multi-level switching circuit 58 can be implemented in a wide variety of ways. In certain implementations, the multi-level switching circuit 58 includes an MLS DC-to-DC converter that generates multiple regulated voltages of different voltage levels, an MLS modulator including a bank of switches each connected between a corresponding regulated voltage and the error amplifier supply voltage $V_{DD\_MLS}$, and a control circuit that processes the sense signal SENSE to open or close particular switches of the bank to thereby generate the error amplifier supply voltage $V_{DD\_MLS}$.

In the illustrated embodiment, the DC-to-DC converter 52 operates to generate a regulated voltage $V_{REG}$. The DC-to-DC converter 52 can be implemented in a wide variety of ways including, but not limited to, using a buck converter, a boost converter, or a buck-boost converter. The DC-to-DC converter 52 is also referred to herein as a switching regulator. Although the envelope tracking system 60 of FIG. 2A includes the DC-to-DC converter 52, other implementations are possible. For example, in another embodiment, the DC-to-DC converter is omitted in favor of using a regulated voltage provided by an MLS DC-to-DC converter of the multi-level switching circuit 58.

With continuing reference to FIG. 2A, the error amplifier 53 includes a first input that receives a reference voltage $V_{REF}$ and a second input that receives the envelope signal ENV. In the illustrated embodiment, the first input is a non-inverting input and the second input is an inverting input. However, other implementations are possible.

The error amplifier 53 further includes an output that is electrically connected to the second input via the feedback circuit 55. The feedback circuit 55 can be implemented in a wide variety of ways. In one example, the feedback circuit 55 includes at least one of a resistor or a capacitor, for instance, a parallel combination of a resistor and a capacitor.

As shown in FIG. 2A, the error amplifier 53 receives power from the error amplifier supply voltage $V_{DD\_MLS}$. In certain implementations, the error amplifier 53 includes two or more stages, and at least an output stage of the error amplifier 53 is powered by the error amplifier supply voltage $V_{DD\_MLS}$. In certain implementations, one or more stages of the error amplifier 53 operate using a different supply voltage than the error amplifier supply voltage $V_{DD\_MLS}$ controlled by the multi-level switching circuit 58. For example, an input stage of the error amplifier 53 can be controlled with a fixed supply voltage. In certain implementations, the current outputted from the error amplifier's input stage is used to generate the sense signal SENSE provided to the multi-level switching circuit 58.

The AC combiner 54 operates to combine the output of the DC-to-DC converter 52 and the output of the error amplifier 53 to generate a power amplifier supply voltage $V_{CC\_PA}$ for the power amplifier 51. The power amplifier 51 amplifies an RF input signal $RF_{IN}$ to generate an RF output signal $RF_{OUT}$. The envelope tracking system 60 receives the envelope signal ENV, which changes in relation to an envelope of the RF input signal $RF_{IN}$.

With continuing reference to FIG. 2A, in certain embodiments, the inverting input of the error amplifier 53 that receives the envelope signal ENV is implemented with lower input impedance relative to the non-inverting input that receives the reference voltage $V_{REF}$. For example, with respect to internal amplification circuitry of the error amplifier 53, the inverting input can connect to transistor drain and/or source regions, while the non-inverting input can connect to a transistor gate region of much higher impedance.

By providing the envelope signal to a low impedance input, a relatively large current can be sourced or sunk as needed to quickly charge or discharge internal capacitances of the error amplifier 53. In contrast, when an envelope tracker's amplifier includes a pair of inputs with high input impedance, an RC time constant associated with charging and discharging capacitances can be relatively large.

Figure 2B:
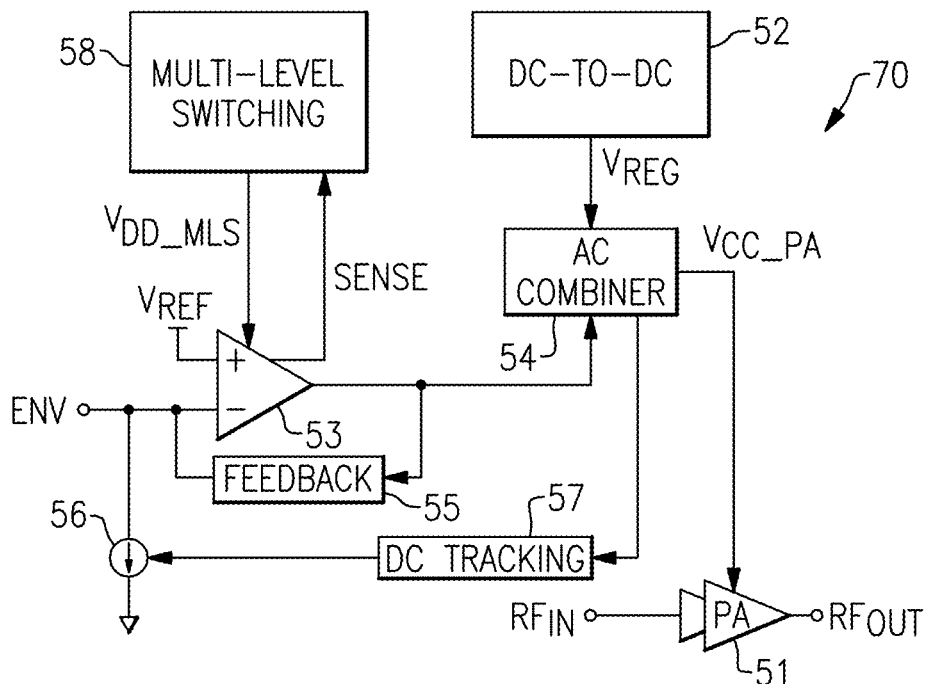
FIG. 2B is a schematic diagram of another embodiment of an envelope tracking system for a power amplifier.

FIG. 2B is a schematic diagram of another embodiment of an envelope tracking system 70 for a power amplifier 51. The envelope tracking system 70 includes a DC-to-DC converter 52, an error amplifier 53, an AC combiner 54, a feedback circuit 55, a current source 56, a DC tracking circuit 57, and a multi-level switching circuit 58.

The envelope tracking system 70 of FIG. 2B is similar to the envelope tracking system 60 of FIG. 2A, except that the envelope tracking system 70 further includes the current source 56 and the DC tracking circuit 57.

The current source 56 is electrically connected to the second input of the error amplifier 53, and provides a current that is controlled by the DC tracking circuit 57. The DC tracking circuit 57 monitors the AC combiner 54 (for instance, one or more currents and/or voltages), and adjusts the current of the current source 56 to maintain suitable DC biasing levels.

Figure 2C:
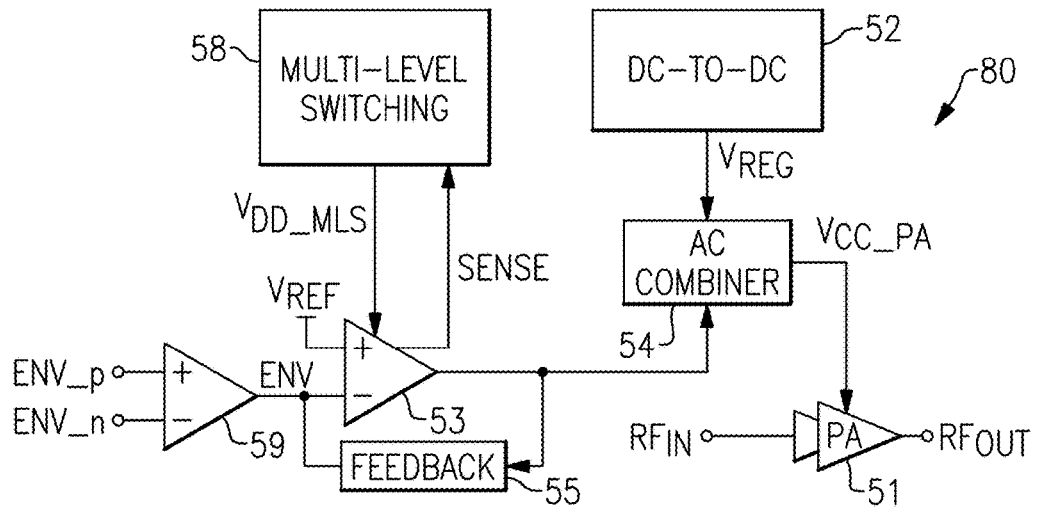
FIG. 2C is a schematic diagram of another embodiment of an envelope tracking system for a power amplifier.

FIG. 2C is a schematic diagram of another embodiment of an envelope tracking system 80 for a power amplifier 51. The envelope tracking system 80 includes a DC-to-DC converter 52, an error amplifier 53, an AC combiner 54, a feedback circuit 55, a multi-level switching circuit 58, and a differential envelope amplifier 59.

The envelope tracking system 80 of FIG. 2C is similar to the envelope tracking system 60 of FIG. 2A, except that the envelope tracking system 80 further includes the differential envelope amplifier 59. As shown in FIG. 2C, the differential envelope amplifier 59 generates the envelope signal ENV based on a differential envelope signal including a non-inverted signal component ENV_p and an inverted signal component ENV_n. Including the differential envelope amplifier 59 can enhance system performance by providing superior noise rejection.

Figure 2D:
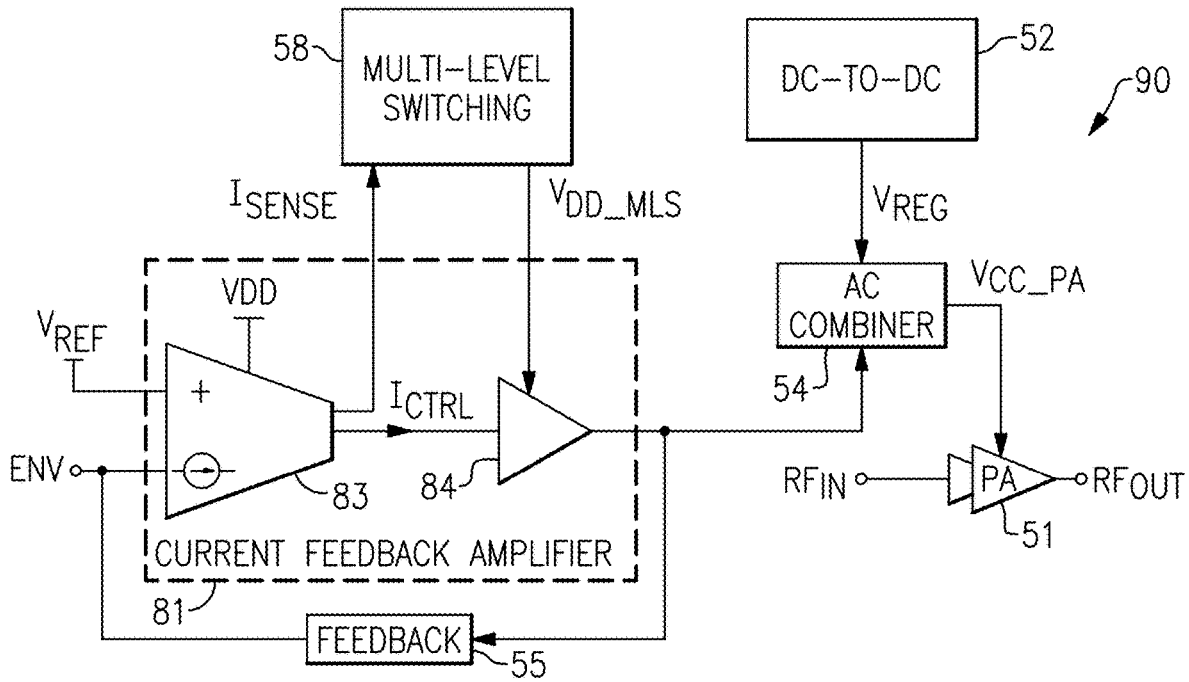
FIG. 2D is a schematic diagram of another embodiment of an envelope tracking system for a power amplifier.

FIG. 2D is a schematic diagram of another embodiment of an envelope tracking system 90 for a power amplifier 51. The envelope tracking system 90 includes a DC-to-DC converter 52, an error amplifier 81, an AC combiner 54, a feedback circuit 55, and a multi-level switching circuit 58.

The envelope tracking system 90 of FIG. 2D is similar to the envelope tracking system 60 of FIG. 2A, except that the envelope tracking system 90 illustrates a specific implementation of an error amplifier.

In particular, the error amplifier 81 of FIG. 2D is implemented as a current feedback amplifier including a transconductance input stage 83 and an output stage 84. The transconductance input stage 83 generates a control current $I_{CTRL}$ based on amplifying a voltage difference between the envelope signal ENV and the reference voltage $V_{REF}$. The control current $I_{CTRL}$ is amplified by the output stage 84 to generate an error amplifier output current that provides adjustment to the voltage level of the power amplifier supply voltage $V_{CC\_PA}$.

In the illustrated embodiment, the transconductance input stage 83 also generates a sense current $I_{SENSE}$ that tracks or changes with the control current $I_{CTRL}$. For example, the sense current $I_{SENSE}$ can be generated by a replica or copy (with or without scaling in size) of the transistors used to generate the control current $I_{CTRL}$.

As shown in FIG. 2D, the transconductance input stage 83 is powered by a supply voltage $V_{DD}$, which can be a fixed supply voltage with a substantially flat voltage level over time. However, other implementations are possible, such as configurations in which the supply voltage $V_{DD}$ is adapted or changed over time. Additionally, the output stage 84 is powered by the error amplifier supply voltage $V_{DD\_MLS}$ from the multi-level switching circuit 58. Implementing the error amplifier 81 in this manner inhibits a change in the voltage level of the error amplifier supply voltage $V_{DD\_MLS}$ from generating a corresponding change in the sense current $I_{SENSE}$.

Figure 3A:
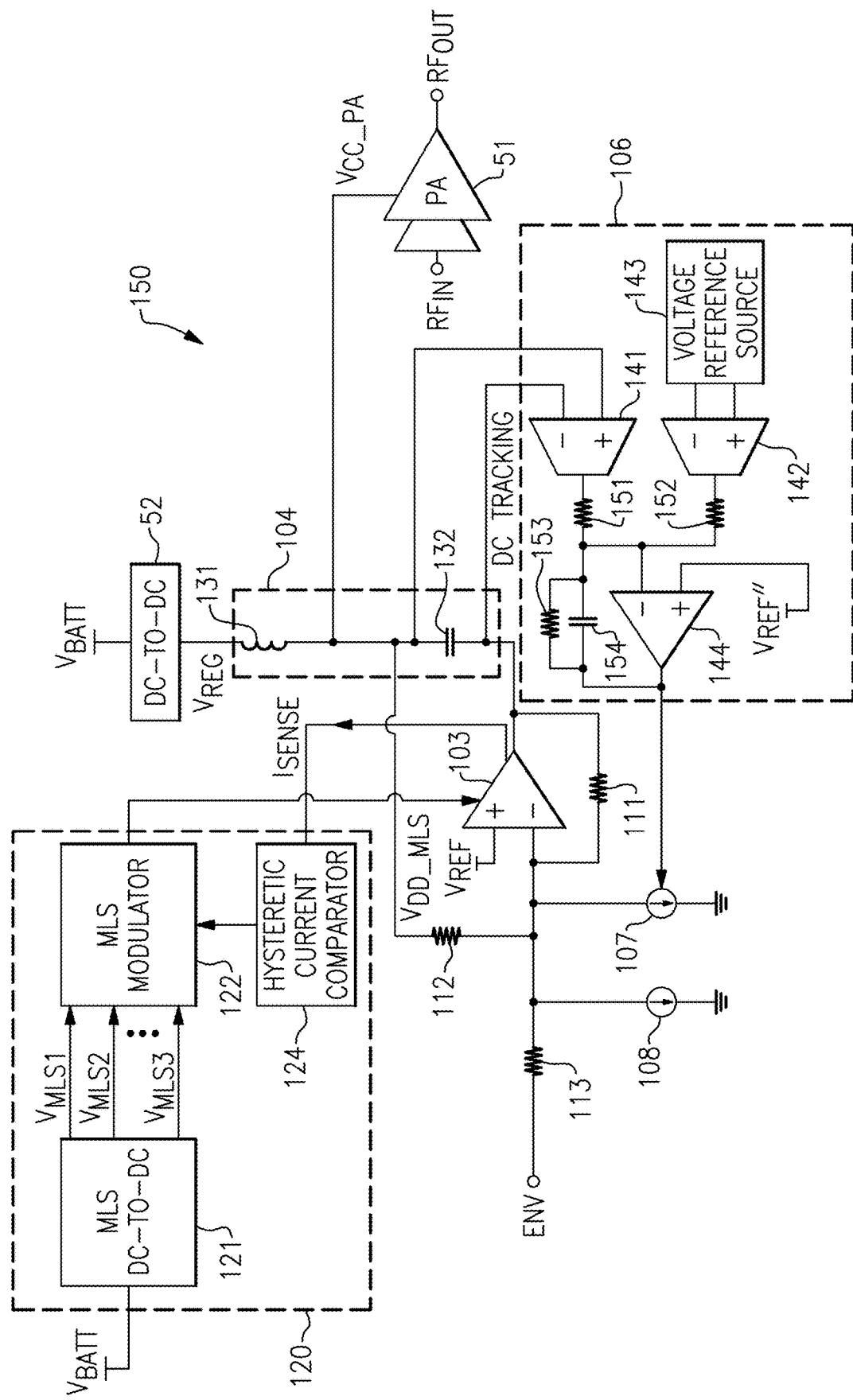
FIG. 3A is a schematic diagram of another embodiment of an envelope tracking system for a power amplifier.

FIG. 3A is a schematic diagram of another embodiment of an envelope tracking system 150 for a power amplifier 51. The envelope tracking system 150 includes a DC-to-DC converter 52, an error amplifier 103, an AC combiner 104, a DC tracking circuit 106, a first current source 107, a second current source 108, a first feedback resistor 111, a second feedback resistor 112, an input resistor 113, and a multi-level switching circuit 120.

In the illustrated embodiment, the multi-level switching circuit 120 includes an MLS DC-to-DC converter 121, an MLS modulator 122, and a hysteretic current comparator 124.

As shown in FIG. 3A, the MLS DC-to-DC converter 121 receives a battery voltage $V_{BATT}$ and generates multiple regulated voltages, corresponding to a first regulated voltage $V_{MLS1}$, a second regulated voltage $V_{MLS2}$, and a third regulated voltage $V_{MLS3}$, in this example. Although an example with the MLS DC-to-DC converter 121 generating three regulated voltages is shown, the MLS DC-to-DC converter 121 can generate more or fewer regulated voltages as indicated by the ellipses. The MLS DC-to-DC converter 121 can be implemented in a wide variety of ways, including, but not limited to, as a buck-boost converter operable to generate one or more buck voltages below the battery voltage $V_{BATT}$ and/or one or more boost voltages above the battery voltage $V_{BATT}$.

With continuing reference to FIG. 3A, the hysteretic current comparator 124 processes a sense current $I_{SENSE}$ from the error amplifier 103 to generate control signals for the MLS modulator 122. The MLS modulator 122 processes the control signals and the MLS regulated voltages to generate the error amplifier supply voltage $V_{DD\_MLS}$ for the error amplifier 103. In certain implementations, the MLS modulator 122 includes a bank of switches that are selectively activated using the control signals from the hysteretic current comparator 124.

Including the hysteretic current comparator 124 aids in controlling the voltage level of the error amplifier supply voltage $V_{DD\_MLS}$ based on the sense current $I_{SENSE}$, while providing hysteresis to stabilize the states of the control signals.

In the illustrated embodiment, the AC combiner 104 includes an inductor 131 and an AC coupling capacitor 132. As shown in FIG. 3A, the inductor 131 is connected between the regulated voltage $V_{REG}$ and the power amplifier supply voltage $V_{CC\_PA}$, and the AC coupling capacitor 132 is connected between the power amplifier supply voltage $V_{CC\_PA}$ and the output of the error amplifier 103.

In the illustrated embodiment, the first feedback resistor 111 is connected between the output and inverting input of the error amplifier 103. Additionally, the second feedback resistor 112 is connected between the power amplifier supply voltage $V_{CC\_PA}$ and the inverting input of the error amplifier 103. Although one example of feedback for an error amplifier is shown, a wide variety of implementations of feedback can be used. Moreover, an error amplifier can be implemented without such feedback.

With continuing reference to FIG. 3A, the envelope signal ENV is provided to the inverting input of the error amplifier 103 via the input resistor 113. Additionally, the non-inverting input of the error amplifier 103 receives the reference voltage $V_{REF}$. The error amplifier 103 generates an output current, which is provided to the power amplifier supply voltage $V_{CC\_PA}$ via the AC coupling capacitor 132 to provide voltage level adjustment to the power amplifier supply voltage $V_{CC\_PA}$. Thus, the output of error amplifier 103 is AC coupled to the power amplifier supply voltage $V_{CC\_PA}$ by way of the AC coupling capacitor 132. In the illustrated embodiment, the error amplifier 103 also generates the sense current $I_{SENSE}$, which changes in relation to the current of the error amplifier 103, for instance, an internal current and/or an output current.

The first current source 107 and the second current source 108 are electrically connected in parallel with one another between the inverting input of the error amplifier 103 and ground. The DC tracking circuit 106 controls a current of the first current source 107 based on a voltage across the AC coupling capacitor 132. In particular, the DC tracking circuit 106 controls the current to maintain the voltage across the AC coupling capacitor 132 relatively constant, thereby helping to maintain sufficient voltage headroom and suitable DC biasing at the output of the error amplifier 103.

In the illustrated embodiment, the DC tracking circuit 106 includes a first amplifier 141, a second amplifier 142, a voltage reference source 143, an output amplifier 144, a first resistor 151, a second resistor 152, a third resistor 153, and a capacitor 154. The first amplifier 141 receives the voltage across the AC coupling capacitor 132, and the second amplifier 142 receives the voltage from the voltage reference source 143. In this example, the first amplifier 141 and the second amplifier 142 are transconductance amplifiers, and the output amplifier 144 is a voltage amplifier.

The DC tracking circuit 106 serves to control the current of the first current source 107 such that the voltage across the capacitor 132 is about equal to that of the voltage reference source 143. For example, when the voltages are equal, the inverting input of the output amplifier 144 is about equal to the reference voltage $V_{REF'''}$. However, when the voltages are unequal, the first amplifier 141 generates a voltage change to the inverting input of the output amplifier 144, which in turn adjusts the current of the first current source 107 to provide DC tracking.

Figure 3B:
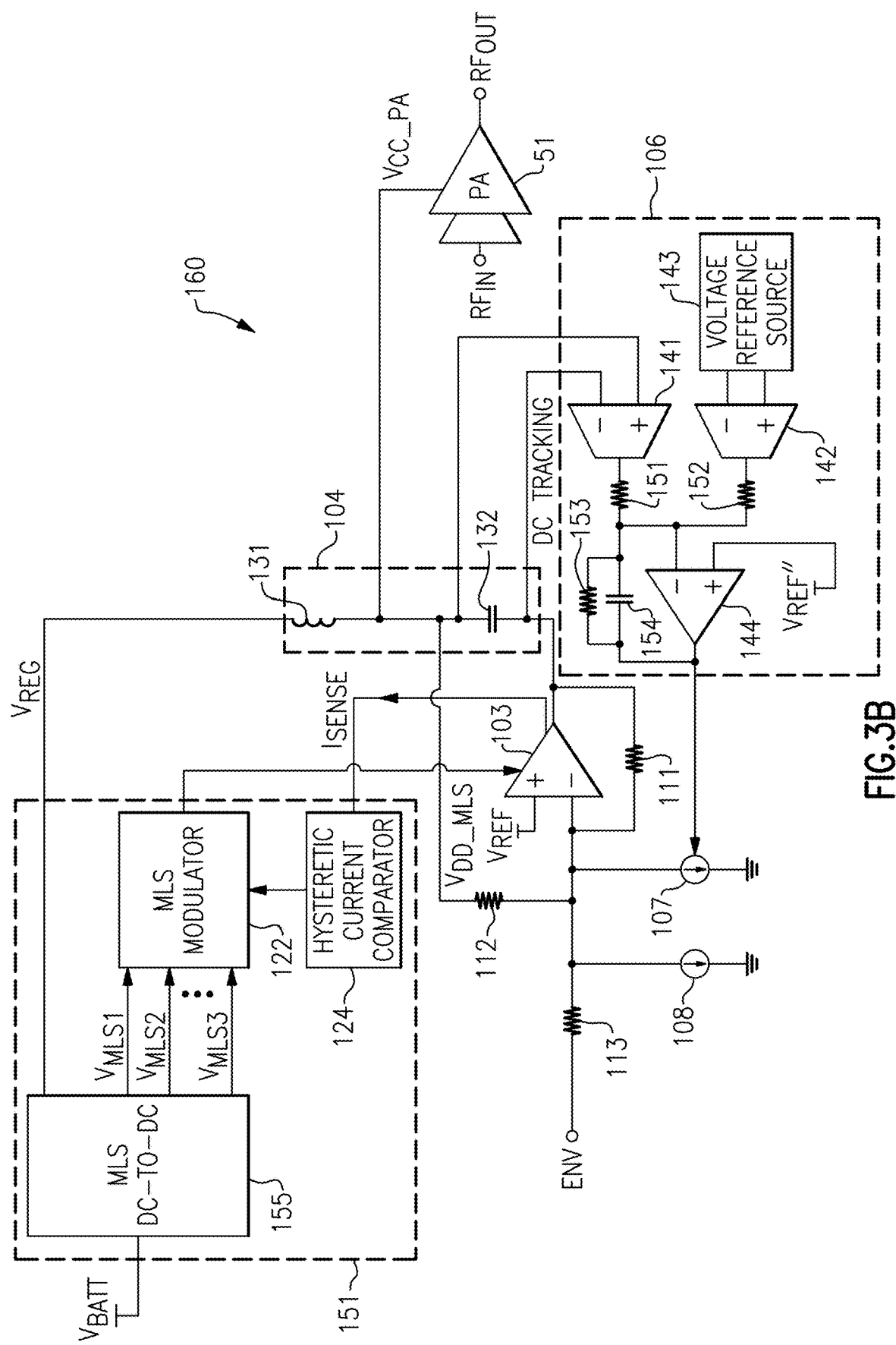
FIG. 3B is a schematic diagram of another embodiment of an envelope tracking system for a power amplifier.

FIG. 3B is a schematic diagram of another embodiment of an envelope tracking system 160 for a power amplifier 51. The envelope tracking system 160 includes an error amplifier 103, an AC combiner 104, a DC tracking circuit 106, a first current source 107, a second current source 108, a first feedback resistor 111, a second feedback resistor 112, an input resistor 113, and a multi-level switching circuit 151.

The envelope tracking system 160 of FIG. 3B is similar to the envelope tracking system 150 of FIG. 3A, except that the envelope tracking system 160 omits the DC-to-DC converter 52 of FIG. 3A in favor of using the multi-level switching circuit 151 to generate the regulated voltage $V_{REG}$.

In particular, the multi-level switching circuit 151 includes an MLS DC-to-DC converter 155, an MLS modulator 122, and a hysteretic current comparator 124. Additionally, the MLS DC-to-DC converter 155 generates not only multiple regulated voltages (corresponding to $V_{MLS1}$, $V_{MLS2}$, and $V_{MLS3}$, in this example) for the MLS modulator 122, but also the regulated voltage $V_{REG}$ for the AC combiner 104. Although an example is depicted in which the regulated voltage $V_{REG}$ is a different voltage from the regulated voltages provided to the MLS modulator 122, in another embodiment the regulated voltage $V_{REG}$ corresponds to one of the regulated voltages provided to the MLS modulator 122.

Figure 3C:
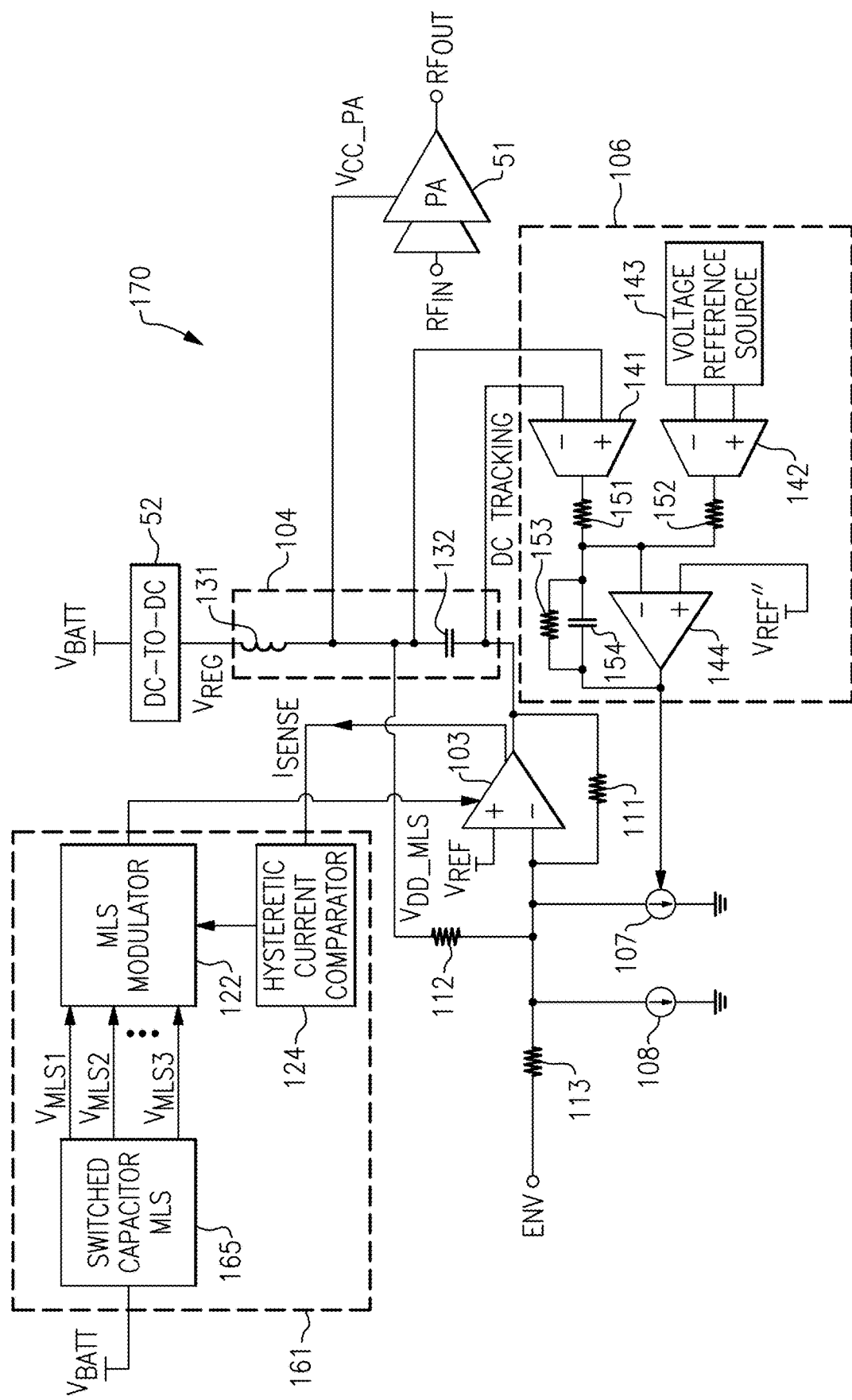
FIG. 3C is a schematic diagram of another embodiment of an envelope tracking system for a power amplifier.

FIG. 3C is a schematic diagram of another embodiment of an envelope tracking system 170 for a power amplifier 51. The envelope tracking system 170 includes an error amplifier 103, an AC combiner 104, a DC tracking circuit 106, a first current source 107, a second current source 108, a first feedback resistor 111, a second feedback resistor 112, an input resistor 113, and a multi-level switching circuit 161. The multi-level switching circuit 161 includes an MLS modulator 122, a hysteretic current comparator 124, and a switched capacitor MLS circuit 165.

The envelope tracking system 170 of FIG. 3C is similar to the envelope tracking system 150 of FIG. 3A, except that the envelope tracking system 170 illustrates an implementation in which the multi-level switching circuit 161 includes the switched capacitor MLS circuit 165. As shown in FIG. 3C, the switched capacitor MLS circuit 165 generates multiple regulated voltages (corresponding to $V_{MLS1}$, $V_{MLS2}$, and $V_{MLS3}$, in this example) for the MLS modulator 122, which is controlled by the hysteretic current comparator 124 to generate the error amplifier supply voltage $V_{DD\_MLS}$.

Using the switched capacitor MLS circuit 165 to generate the regulated voltages for the MLS modulator 122 can provide a relatively compact area relative to an inductor-based MLS DC-to-DC converter, such as a buck-boost converter. Furthermore, the switched capacitor MLS circuit 165 can provide advantages for capacitor stacking to achieve higher voltage. For example, the switched capacitor MLS circuit 165 can include one or more charge pumps for generating boosted voltages. Although the switched capacitor MLS circuit 165 can provide certain advantages, the switched capacitor MLS circuit 165 can also have lower efficiency than an inductor-based MLS DC-to-DC converter.

Figure 4:
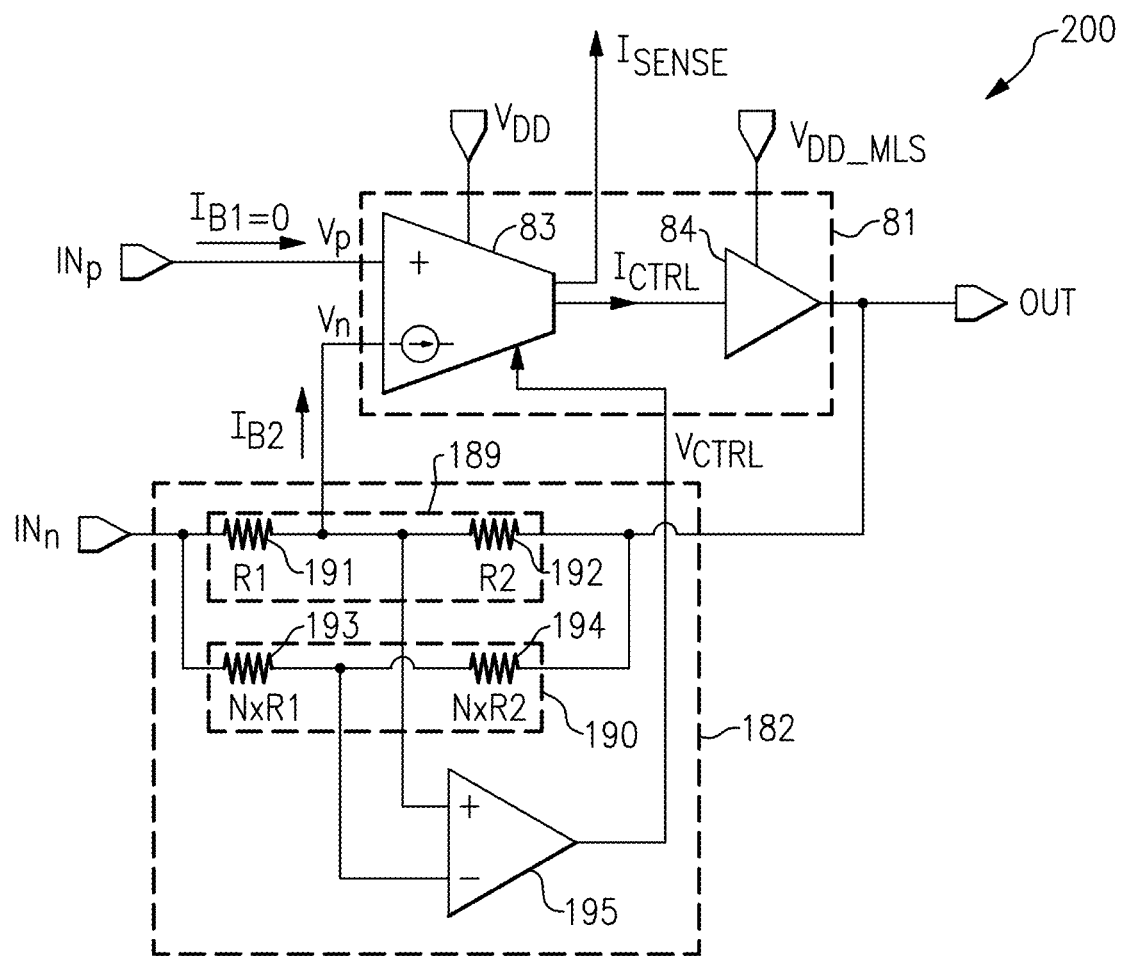
FIG. 4 is a schematic diagram of one embodiment of an error amplifier for an envelope tracking system.

FIG. 4 is a schematic diagram of one embodiment of an error amplifier 200 for an envelope tracking system. The error amplifier 200 includes a current feedback amplifier 81 and an input current reduction circuit 182. The current feedback amplifier 81 includes a transconductance input stage 83 and an output stage 84.

The error amplifier 200 of FIG. 4 illustrates one embodiment of an error amplifier for an envelope tracker. Although one example of an error amplifier is shown, the teachings herein are applicable to error amplifiers implemented in other ways.

The transconductance input stage 83 generates a control current $I_{CTRL}$ based on a voltage difference between a first input $V_p$ and a second input $V_n$. The control current $I_{CTRL}$ is amplified by the output stage 84. In this example, the transconductance input stage 83 is controlled by a control voltage $V_{CTRL}$, as will be discussed further below.

In the illustrated embodiment, the transconductance input stage 83 generates a sense current $I_{SENSE}$ that tracks or changes with the control current $I_{CTRL}$. Additionally, the transconductance input stage 83 is powered by a supply voltage $V_{DD}$, while the output stage 84 is powered by the error amplifier supply voltage $V_{DD\_MLS}$.

The current feedback amplifier 81 serves to provide amplification between the first input $IN_p$ and the second input $IN_n$, which receive a reference signal and an envelope signal, respectively. The current feedback amplifier 81 further generates an output current on the output OUT. The output current is used to adjust a voltage level of a power amplifier supply voltage.

With continuing reference to FIG. 4, the current feedback amplifier 81 includes a first input $V_p$ with relatively high input impedance and a second input $V_n$ with relatively low input impedance. The current feedback amplifier 81 has been annotated to show a first input current $I_{B1}$ into the first input $V_p$ of about 0 mA, and a second input current $I_{B2}$ into the second input $V_n$.

Implementing the second input $V_n$ of the current feedback amplifier 81 with low input impedance provides a rapid transient response and high envelope tracking bandwidth, since the envelope signal is provided to the second input $V_n$. For example, the second input $V_n$ can source or sink a relatively large current to quickly charge or discharge internal capacitances of the current feedback amplifier 81 to provide a fast transient response. In certain configurations, an input impedance into the second input $V_n$ is at least a factor of ten lower than an input impedance into the first input $V_p$.

As shown in FIG. 4, the input current reduction circuit 182 controls a control voltage $V_{CTRL}$ of the current feedback amplifier 81. As a voltage level of the control voltage $V_{CTRL}$ changes, biasing of the current feedback amplifier 81 varies, which results in the input current $I_{B2}$ into the second input $V_n$ changing.

The input current reduction circuit 182 serves to dynamically adjust the control voltage $V_{CTRL}$ to reduce the input current $I_{B2}$. Biasing the current feedback amplifier 81 at a bias level in which the input current $I_{B2}$ is relatively small further enhances the speed of amplification circuitry. For example, the current feedback amplifier 81 can rapidly respond to an increase or decrease in the envelope signal when biased in this manner.

Accordingly, including the input current reduction circuit 182 aids in providing wide envelope tracking bandwidth, for instance, 180 MHz or more of modulation bandwidth.

In the illustrated embodiment, the input current reduction circuit 182 includes a first voltage divider 189 including a first resistor 191 of resistance R1 and a second resistor 192 of resistance R2 connected in series between the second input $IN_n$ and the output OUT. The second input $IN_n$ is connected to the current feedback amplifier 81 via the first resistor 191, and thus the first voltage divider 189 serves to detect changes in the second input current $I_{B2}$. The input current reduction circuit 182 further includes a second voltage divider 190 including a third resistor 193 of resistance N*R1 and a fourth resistor 194 of resistance N*R2 connected in series between the second input $IN_n$ and the output OUT. The input current reduction circuit 182 further includes a control amplifier 195 configured to generate the control voltage $V_{CTRL}$ based on a voltage difference between a first divided voltage generated by the first voltage divider 189 and a second divided voltage generated by the second voltage divider 190.

In certain implementations, N is greater than one, for example, by a factor of 5 or more, thereby implementing the second voltage divider 190 with greater resistivity than the first voltage divider 189.

Figure 5:
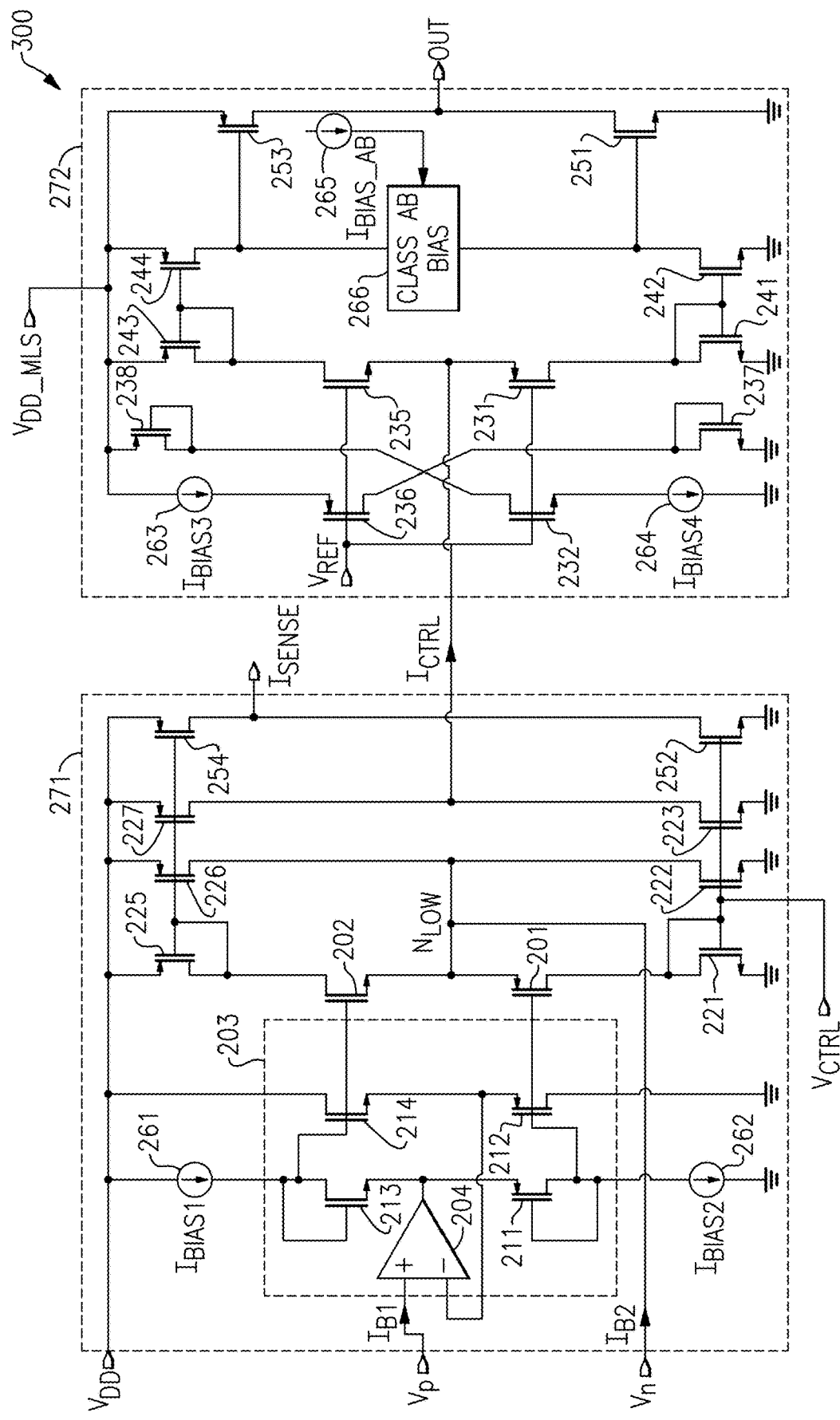
FIG. 5 is a schematic diagram of one embodiment of a current feedback amplifier for the error amplifier of FIG. 4.

FIG. 5 is a schematic diagram of one embodiment of a current feedback amplifier 300 for the error amplifier 200 of FIG. 4. Although one example of suitable amplification circuitry for an error amplifier is shown, an error amplifier can include amplification circuitry implemented in a wide variety of ways.

In the illustrated embodiment, the current feedback amplifier 300 includes p-type field-effect transistors (PFETs) 201, 211, 212, 225, 226, 227, 231, 236, 238, 243, 244, 253, and 254. The current feedback amplifier 300 further includes n-type field-effect transistors (NFETs) 202, 213, 214, 221, 222, 223, 232, 235, 237, 241, 242, 251, and 252. The current feedback amplifier 300 further includes first to fourth bias current sources 261-264, respectively, a class AB current source 265, and a class AB bias circuit 266. Additionally, the current feedback amplifier 300 includes a buffer 204. As shown in FIG. 5, the buffer 204, the PFET 211, the PFET 212, the NFET 213, and the NFET 214 operate as a first input circuit 203. The buffer circuit 204 includes a positive input of high impedance (for instance, a transistor gate), and a negative input of high impedance (for instance, a transistor gate).

As shown in FIG. 5, the circuitry of the current feedback amplifier 300 is partitioned between a transconductance input stage 271 and an output stage 272. Additionally, the transconductance input stage 271 is powered by a supply voltage $V_{DD}$, while the output stage 272 is powered by an error amplifier supply voltage $V_{DD\_MLS}$ provided by a multi-level switching circuit.

The current feedback amplifier 300 includes a first input $V_p$ and a second input $V_n$, which are of different input impedance. In particular, the first input $V_p$ is connected to the buffer 204, which can include a transistor gate and/or other high input impedance elements. In contrast, the second input $V_p$ connects to sources of PFET 201 and NFET 202 and drains of NFET 222 and PFET 226 at a low impedance node $N_{LOW}$.

By implementing the second input $V_p$ that receives the envelope signal with low impedance, the second input $V_p$ can source or sink a relatively large current to quickly charge or discharge internal capacitances of the current feedback amplifier 300 in response to changes in the envelope signal. Thus, high bandwidth is provided.

The current feedback amplifier 300 generates an output current at an output OUT, and a sense current at output $I_{SENSE}$. Additionally, the current feedback amplifier 300 operates with a class AB bias circuit 266 to provide a push-pull output stage for enhanced bandwidth. The current feedback amplifier 300 is also implemented to operate with relatively low swing of internal nodes, thus further providing fast transient response by reducing the amount of charging and discharging needed to respond to a change in the envelope signal.

With continuing reference to FIG. 5, the current feedback amplifier 300 receives a reference voltage $V_{REF}$, which can be the same or a different reference voltage from the reference voltage of FIGS. 2A-3C and 8-10.

The current feedback amplifier 300 further receives the control voltage $V_{CTRL}$, which can be controlled by an input current reduction circuit, such as the input current reduction circuit 182 of FIG. 4.

In the illustrated embodiment, the PFET 254 and the NFET 252 operate to generate the sense current $I_{SENSE}$. Additionally, the PFET 227 and the NFET 223 generate the control current $I_{CTRL}$ provided to the output stage 272. In certain implementations, the PFET 254 is a replica (with or without scaling) of the PFET 227 and/or the NFET 252 is a replica (with or without scaling) of the NFET 223. Implementing the transconductance input stage 271 in this manner aids in generating the sense current $I_{SENSE}$ to track the control current $I_{CTRL}$.

Figure 6A:
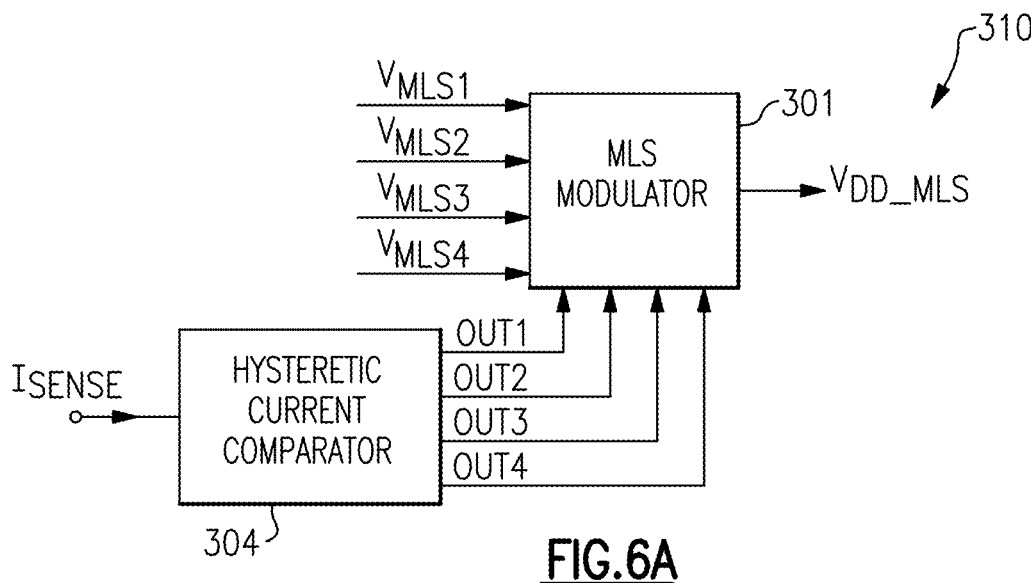
FIG. 6A is a schematic diagram of one embodiment of a multi-level supply (MLS) modulator and control circuit.

FIG. 6A is a schematic diagram of one embodiment of an MLS modulator and control circuit 310. The MLS modulator and control circuit 310 includes an MLS modulator 301 and a hysteretic current comparator 304.

Although one embodiment of a portion of a multi-level switching circuit is shown, the teachings herein are applicable to multi-level switching circuits implemented in a wide variety of ways.

In the illustrated embodiment, the MLS modulator 301 receives several regulated voltages of different levels, including a first regulated voltage $V_{MLS1}$, a second regulated voltage $V_{MLS2}$, a third regulated voltage $V_{MLS3}$, and a fourth regulated voltage $V_{MLS4}$, in this example. Although an example with four regulated voltages is shown, the MLS modulator 301 can receive more or fewer regulated voltages.

The hysteretic current comparator 304 receives a sense current $I_{SENSE}$, and generates multiple output signals for controlling the MLS modulator 301. In this example, the output signals include a first output signal OUT1, a second output signal OUT2, a third output signal OUT3, and a fourth output signal OUT4.

With continuing reference to FIG. 6A, the output signals control the MLS modulator 301 to generate an error amplifier supply voltage $V_{DD\_MLS}$. In certain implementations, the MLS modulator 301 includes a bank of switches with each switch connected between the error amplifier supply voltage $V_{DD\_MLS}$ and a corresponding regulated voltage. Additionally, the output signals from the hysteretic comparator 304 are processed by the MLS modulator 301 to control opening and closing of the switches to thereby control the voltage level of the error amplifier supply voltage $V_{DD\_MLS}$.

Figure 6B:
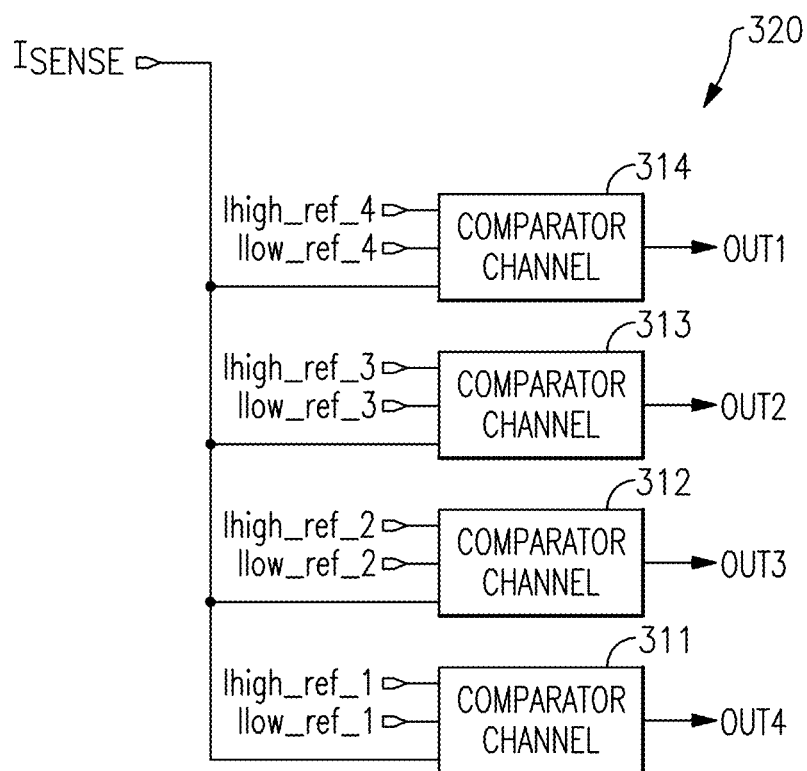
FIG. 6B is a schematic diagram of one embodiment of a hysteretic current comparator for the MLS modulator and control circuit of FIG. 6A.

FIG. 6B is a schematic diagram of one embodiment of a hysteretic current comparator 320 for the MLS modulator and control circuit 310 of FIG. 6A. As shown in FIG. 6B, the hysteretic current comparator 320 includes multiple hysteretic comparator circuits or channels for processing the sense current $I_{SENSE}$. In this example, a first hysteretic comparator channel 311, a second hysteretic comparator channel 312, a third hysteretic comparator channel 313, and a fourth hysteretic comparator channel 314 are provided. Although an example with four hysteretic comparator channels is shown, more or fewer hysteretic comparator channels can be included.

Although one embodiment of a portion of a multi-level switching circuit is shown, the teachings herein are applicable to multi-level switching circuits implemented in a wide variety of ways.

As shown in FIG. 6B, each of the hysteretic comparator channels 311-314 receives the sense current $I_{SENSE}$, which is compared to a high current reference and a low current reference for that channel. The hysteretic comparator channels 311-314 each operate with different high current references and low current references.

For example, the first hysteretic comparator channel 311 operates with a first high current reference Ihigh_ref_1 and a first low current reference Ilow_ref_1. Additionally, the second hysteretic comparator channel 312 operates with a second high current reference Ihigh_ref_2 and a second low current reference Ilow_ref_2, the third hysteretic comparator channel 313 operates with a third high current reference Ihigh_ref_3 and a third low current reference Ilow_ref_3, and the fourth hysteretic comparator channel 314 operates with a fourth high current reference Ihigh_ref_4 and a fourth low current reference Ilow_ref_4.

With continuing reference to FIG. 6B, the first to fourth hysteretic comparator channels 311-314 process the sense current $I_{SENSE}$ to generate first to fourth output signals OUT1-OUT4, respectively. The output signal for a particular channel indicates a result of a comparison of the sense current $I_{SENSE}$ to the high current reference and the low current reference received by that channel.

Figure 6C:
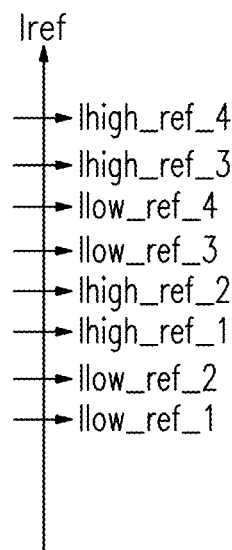
FIG. 6C is one example of a graph of reference current levels for a hysteretic current comparator.

FIG. 6C is one example of a graph of reference current levels for a hysteretic current comparator. The graph depicts example reference current ($I_{REF}$) levels for the hysteretic current comparator 320 of FIG. 6B. Although one example of reference current levels is shown, other implementations are possible.

Figure 7:
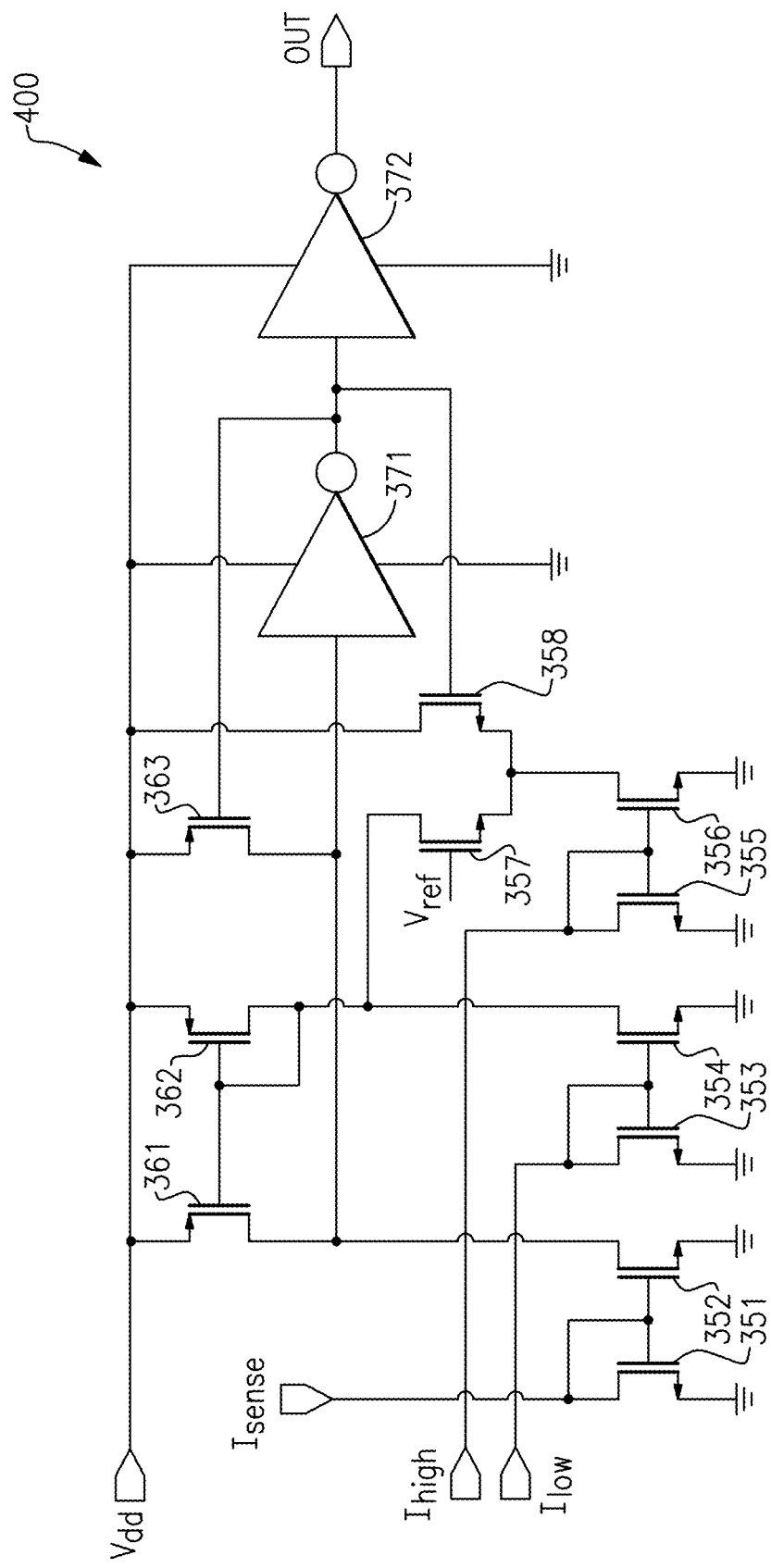
FIG. 7 is a schematic diagram of a hysteretic comparator channel according to one embodiment.

FIG. 7 is a schematic diagram of a hysteretic comparator channel 400 according to one embodiment. The hysteretic comparator channel 400 includes first to eight NFETs 351-358, respectively, first to third PFETs 361-363, respectively, a first output inverter 371, and a second output inverter 372.

The hysteretic comparator channel 400 illustrates one embodiment of a hysteretic comparator channel for the hysteretic current comparator 320 of FIG. 6B. For example, four instantiations of the hysteretic comparator channel 400 can be provided to implement the hysteretic current comparator 320 of FIG. 6B. Although one embodiment of a hysteretic comparator channel is shown, a hysteretic comparator channel can be implemented in other ways.

In the illustrated embodiment, the hysteretic comparator channel 400 is powered by a supply voltage $V_{dd}$, and generates an output signal OUT based on comparing a sense current $I_{sense}$ to a high current threshold $I_{high}$ and a low current threshold $I_{ref}$. The hysteretic comparator channel 400 further receives a reference voltage $V_{ref}$ for controlling an amount of hysteresis of the hysteretic comparator channel 400.

Figure 8:
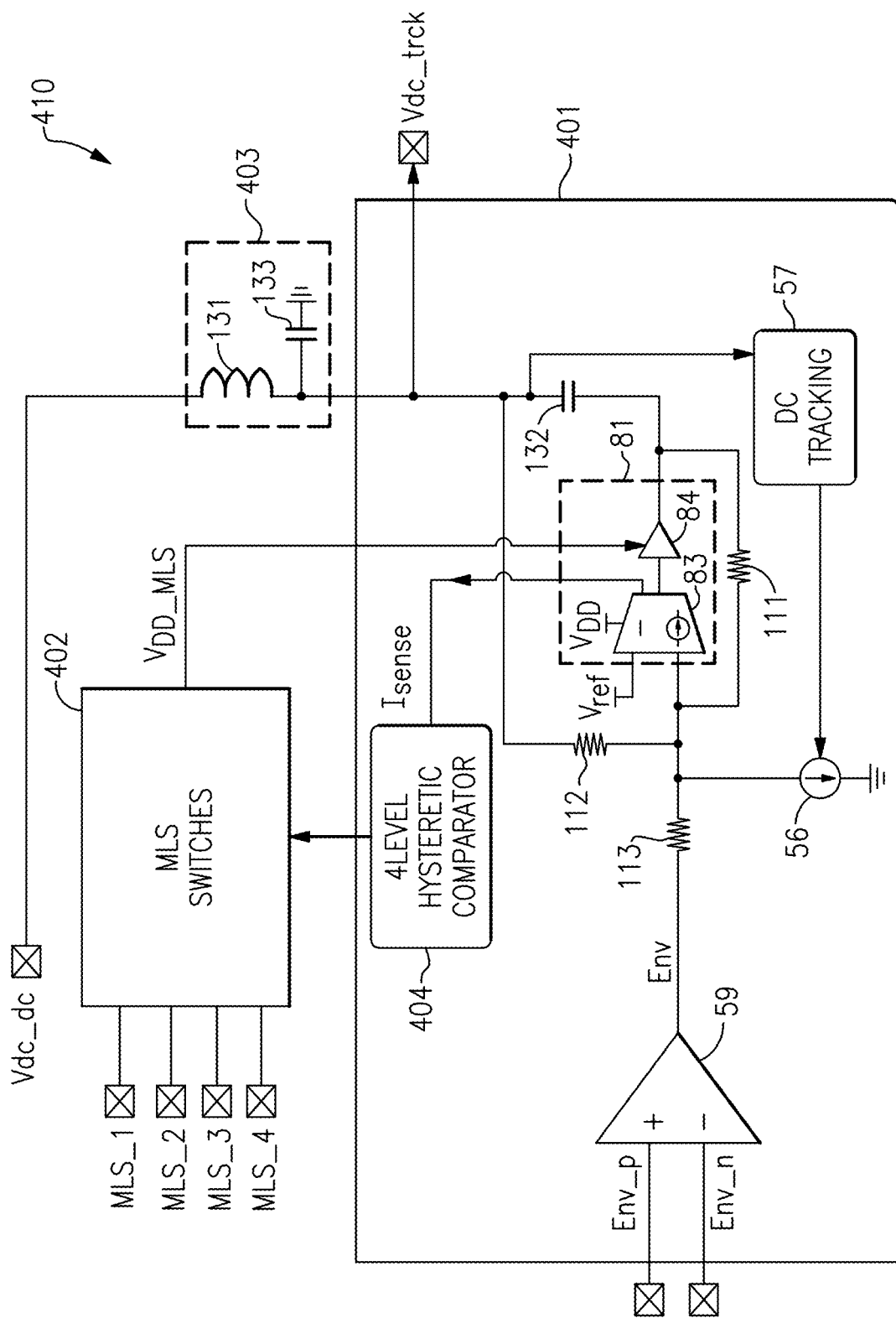
FIG. 8 is a schematic diagram of another embodiment of an envelope tracking system for a power amplifier.

FIG. 8 is a schematic diagram of another embodiment of an envelope tracking system 410 for a power amplifier. The envelope tracking system 410 includes error amplifier circuitry 401, MLS switches 402, and passive components 403.

Although another embodiment of an envelope tracking system is shown, the teachings herein are applicable to envelope tracking systems implemented in a wide variety of ways.

In certain implementations, the envelope tracking system 410 is implemented on a multi-chip module, with the error amplifier circuitry 401 implemented on a first semiconductor chip on the module's substrate, the MLS switches 402 implemented on a second semiconductor chip on the module's substrate, and the passive components 403 implemented as surface mount components (SMCs). However, other implementations are possible.

In the illustrated embodiment, the error amplifier circuitry 401 includes a current source 56, a DC tracking circuit 57, a differential envelope amplifier 59, an error amplifier 81, a first feedback resistor 111, a second feedback resistor 112, an input resistor 113, an AC combining capacitor 132, and a hysteretic comparator 404 (four level, in this example). The error amplifier circuitry 401 processes a differential envelope signal (Env_p, Env_n) to control a supply voltage (Vdc_trck) of a power amplifier. The error amplifier circuitry 401 also provides control signals to the MLS switches 402.

As shown in FIG. 8, the MLS switches 402 receive regulated MLS voltages (MLS_1, MLS_2, MLS_3, and MLS_4, in this example) and the control signals from the error amplifier circuitry 401, and generates an error amplifier supply voltage ($V_{DD\_MLS}$) for the error amplifier circuitry 401.

In the illustrated embodiment, the envelope tracking system 410 includes an AC combiner implemented using the AC combining capacitor 132 and the passive components 403. The passive components include an AC combining inductor 131 and a shunt capacitor 133, in this example. Additionally, the AC combining inductor 131 is connected between a regulated voltage (Vdc_dc) from a DC-to-DC converter and the power amplifier supply voltage (Vdc_trck).

Figure 9A:
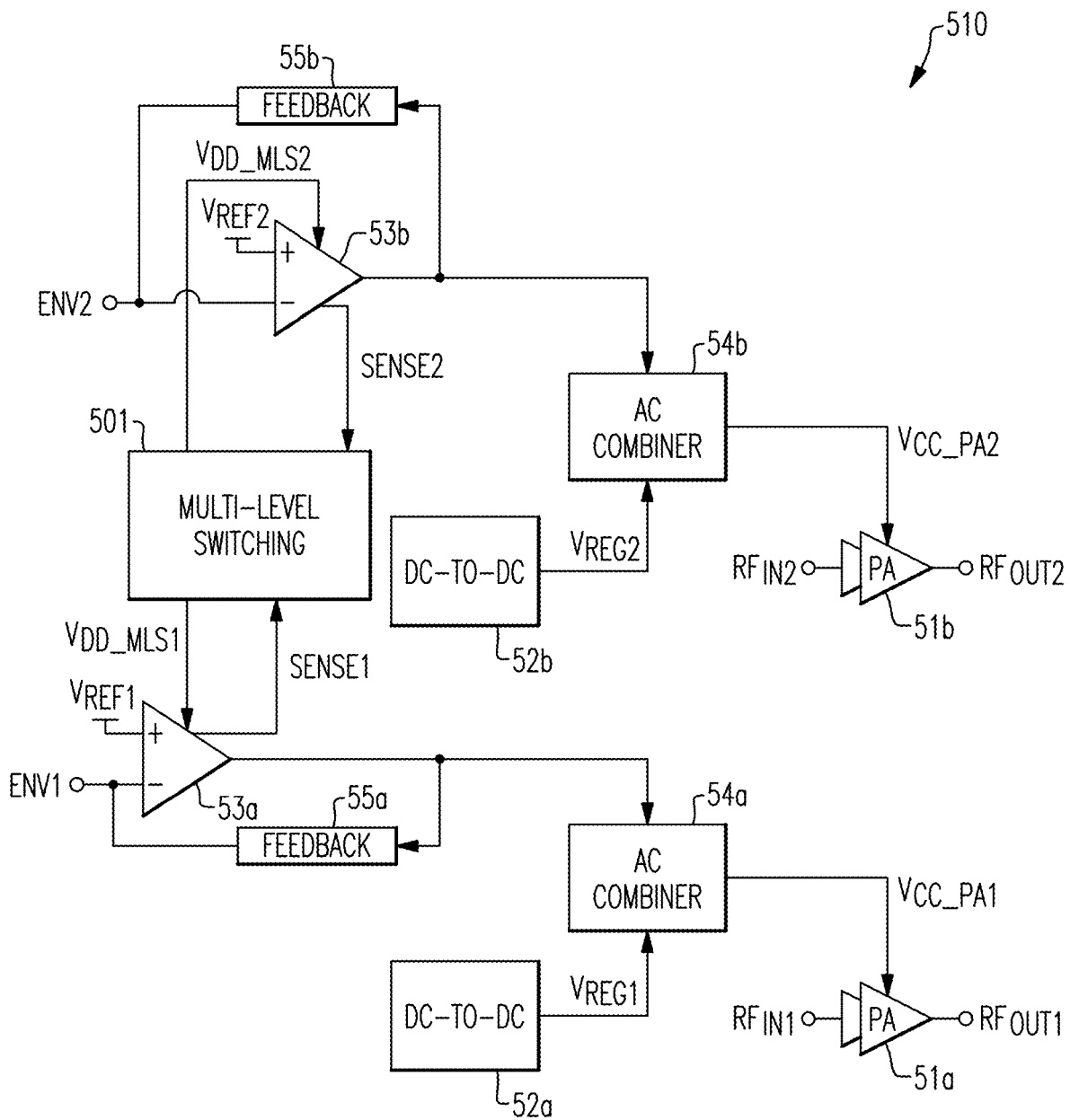
FIG. 9A is a schematic diagram of one embodiment of an envelope tracking system for multiple power amplifiers.

FIG. 9A is a schematic diagram of one embodiment of an envelope tracking system 510 for a first power amplifier 51a and a second power amplifier 51b. The envelope tracking system 510 includes a first DC-to-DC converter 52a, a second DC-to-DC converter 52b, a first error amplifier 53a, a second error amplifier 53b, a first AC combiner 54a, a second AC combiner 54b, a first feedback circuit 55a, a second feedback circuit 55b, and a multi-level switching circuit 501.

As shown in FIG. 9A, the first power amplifier 51a amplifies a first RF input signal $RF_{IN1}$ to generate a first RF output signal $RF_{OUT1}$. Additionally, the second power amplifier 51b amplifies a second RF input signal $RF_{IN2}$ to generate a second RF output signal $RF_{OUT2}$. Although depicted as including two stages, the first power amplifier 51a and/or the second power amplifier 51b can include more or fewer stages.

Furthermore, although an example is depicted in which the envelope tracking system 510 generates power amplifier supply voltages for two power amplifiers, the envelope tracking system 510 can be adapted to generate power amplifier supply voltages for three or more power amplifiers.

As shown in FIG. 9A, the multi-level switching circuit 501 receives a first sense signal SENSE1 from the first error amplifier 53a, which the multi-level switching circuit 501 processes to generate a first error amplifier supply voltage $V_{DD\_MLS1}$ for powering the first error amplifier 53a. Additionally, the first error amplifier 53a includes a first input that receives a first reference voltage $V_{REF1}$ and a second input that receives a first envelope signal ENV1, which changes in relation to an envelope of the first RF input signal $RF_{IN1}$. The first error amplifier 53a further includes an output that is electrically connected to the second input via the first feedback circuit 55a.

The multi-level switching circuit 501 further receives a second sense signal SENSE2 from the second error amplifier 53b, which the multi-level switching circuit 501 processes to generate a second error amplifier supply voltage $V_{DD\_MLS2}$ for powering the second error amplifier 53b. Additionally, the second error amplifier 53b includes a first input that receives a second reference voltage $V_{REF2}$ and a second input that receives a second envelope signal ENV2, which changes in relation to an envelope of the second RF input signal $RF_{IN2}$. The second error amplifier 53b further includes an output that is electrically connected to the second input via the second feedback circuit 55b.

As shown in FIG. 9A, the first DC-to-DC converter 52a generates a first regulated voltage $V_{REG1}$, while the second DC-to-DC converter 52b generates a second regulated voltage $V_{REG2}$.

With continuing reference to FIG. 9A, the first AC combiner 54a operates to combine the first regulated voltage $V_{REG1}$ and the output current of the first error amplifier 53a to generate a first power amplifier supply voltage $V_{CC\_PA1}$ for the first power amplifier 51a. Additionally, the second AC combiner 54b operates to combine the second regulated voltage $V_{REG2}$ and the output current of the second error amplifier 53b to generate a second power amplifier supply voltage $V_{CC\_PA2}$ for the second power amplifier 51b.

In the illustrated embodiment, the multi-level switching circuit 501 is shared to generate the first power amplifier supply voltage $V_{CC\_PA1}$ for the first power amplifier 51a and the second power amplifier supply voltage $V_{CC\_PA2}$ for the second power amplifier 51b. Sharing the multi-level switching circuit 501 can provide a number of advantages, such as reduced component count and/or lower cost.

In certain implementations, the first power amplifier 51a and the second power amplifier 51b are used to amplify different carrier frequencies, for instance, for uplink carrier aggregation scenarios in 5G.

Figure 9B:
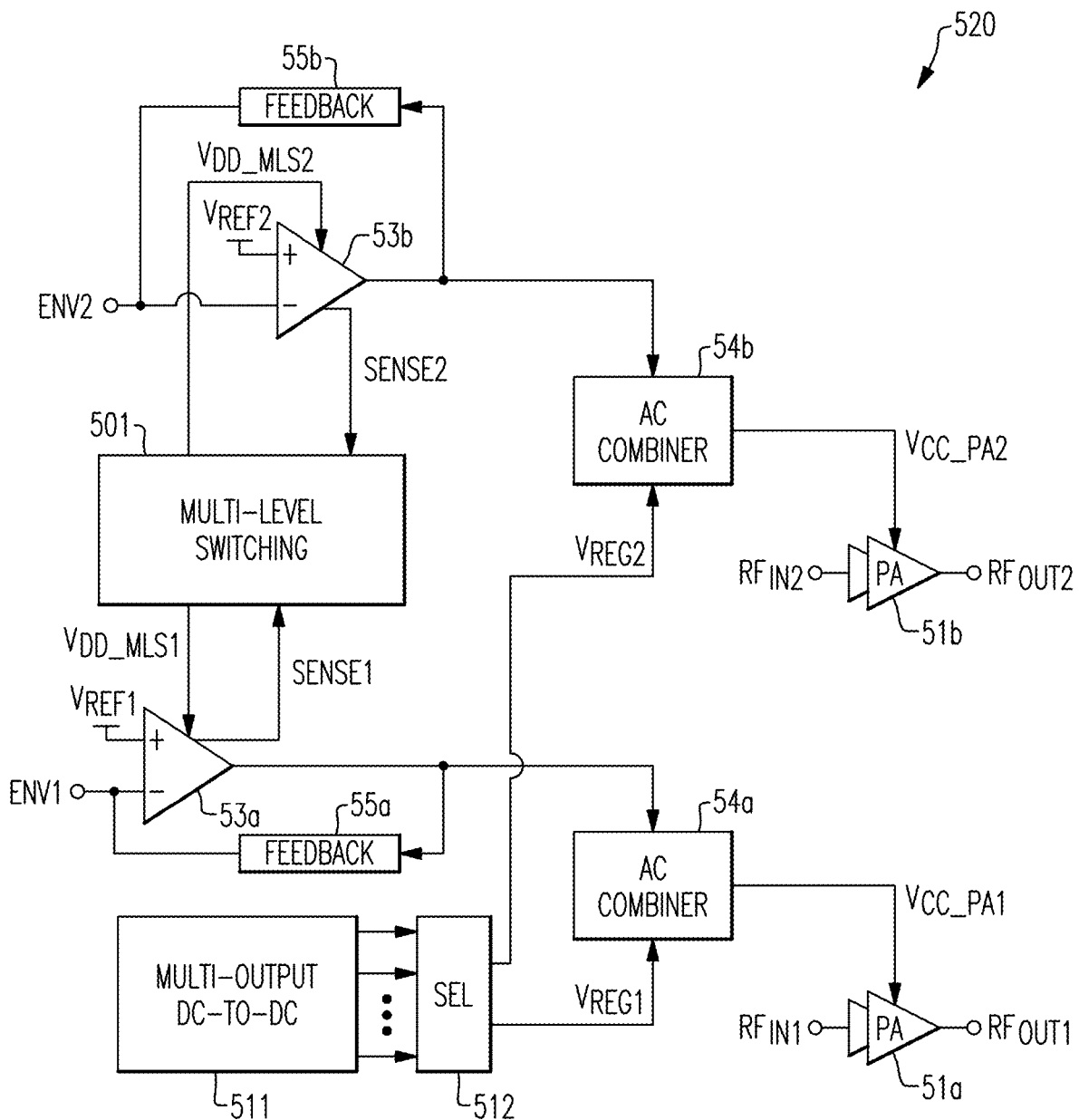
FIG. 9B is a schematic diagram of another embodiment of an envelope tracking system for multiple power amplifiers.

FIG. 9B is a schematic diagram of another embodiment of an envelope tracking system 520 for a first power amplifier 51a and a second power amplifier 51b. The envelope tracking system 520 includes a first error amplifier 53a, a second error amplifier 53b, a first AC combiner 54a, a second AC combiner 54b, a first feedback circuit 55a, a second feedback circuit 55b, a multi-level switching circuit 501, a multi-output DC-to-DC converter 511, and a DC voltage selection circuit 512.

The envelope tracking system 520 of FIG. 9B is similar to the envelope tracking system 510 of FIG. 9A, except that the envelope tracking system 520 of FIG. 9B omits the first DC-to-DC converter 52a and the second DC-to-DC converter 52b of FIG. 9A in favor of including the multi-output DC-to-DC converter 511 for generating the first regulated voltage $V_{REG1}$ and the second regulated voltage $V_{REG2}$. Thus, a common or shared DC-to-DC converter can be used to generate the DC voltages for two or more combiners.

To further enhance flexibility, the envelope tracking system 520 further includes the DC voltage selection circuit 512 for providing controllability as to which the output voltage of the multi-output DC-to-DC converter 511 serves as the first regulated voltage $V_{REG1}$ and which output voltage of the multi-output DC-to-DC converter 511 serves as the second regulated voltage $V_{REG2}$. For example, the multi-output DC-to-DC converter 511 generates two or more output voltages, each of which are selectable by the DC voltage selection circuit 512 (for instance, by digital data received over a bus) as the first regulated voltage $V_{REG1}$ and/or the second regulated voltage $V_{REG2}$.

Figure 9C:
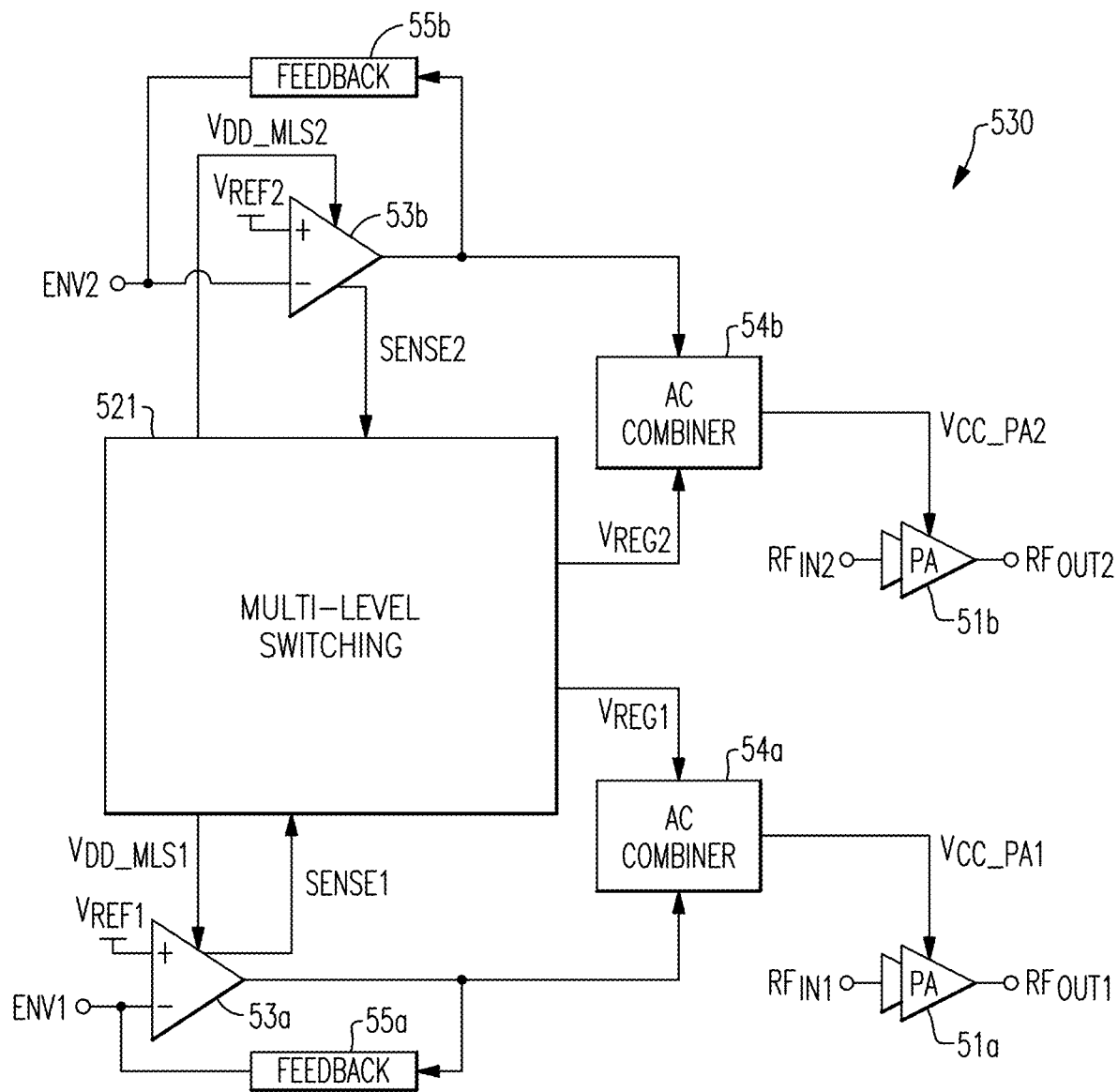
FIG. 9C is a schematic diagram of another embodiment of an envelope tracking system for multiple power amplifiers.

FIG. 9C is a schematic diagram of another embodiment of an envelope tracking system 530 for a first power amplifier 51a and a second power amplifier 51b. The envelope tracking system 530 includes a first error amplifier 53a, a second error amplifier 53b, a first AC combiner 54a, a second AC combiner 54b, a first feedback circuit 55a, a second feedback circuit 55b, and a multi-level switching circuit 521.

The envelope tracking system 530 of FIG. 9C is similar to the envelope tracking system 510 of FIG. 9A, except that the envelope tracking system 530 of FIG. 9C omits the first DC-to-DC converter 52a and the second DC-to-DC converter 52b of FIG. 9A in favor of using the multi-level switching circuit 521 to generate the first regulated voltage $V_{REG1}$ and the second regulated voltage $V_{REG2}$.

Figure 9D:
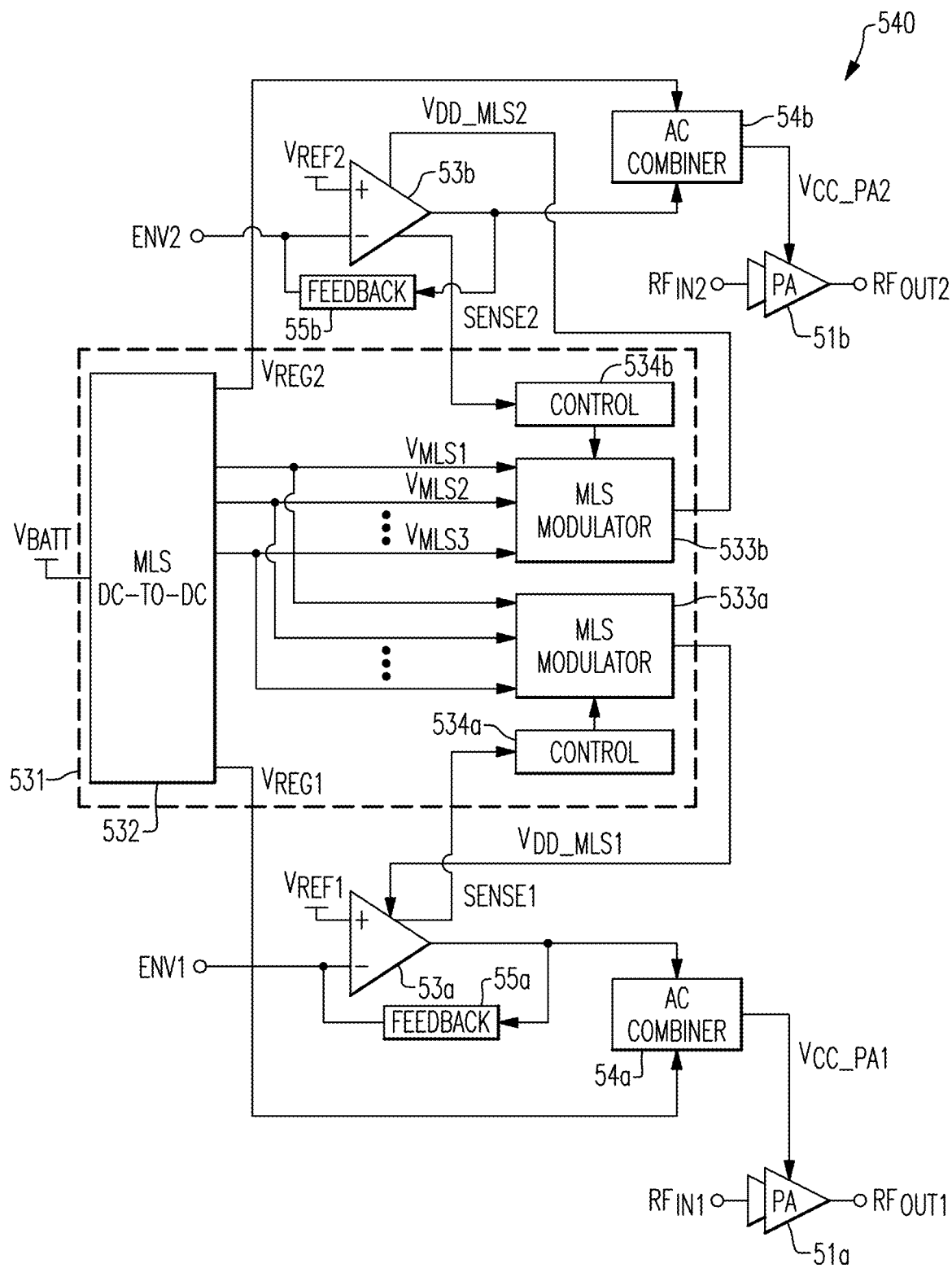
FIG. 9D is a schematic diagram of another embodiment of an envelope tracking system for multiple power amplifiers.

FIG. 9D is a schematic diagram of another embodiment of an envelope tracking system 540 for a first power amplifier 51a and a second power amplifier 51b. The envelope tracking system 540 includes a first error amplifier 53a, a second error amplifier 53b, a first AC combiner 54a, a second AC combiner 54b, a first feedback circuit 55a, a second feedback circuit 55b, and a multi-level switching circuit 531.

The envelope tracking system 540 of FIG. 9D is similar to the envelope tracking system 530 of FIG. 9C, except that the multi-level switching circuit 531 of FIG. 9D illustrates one embodiment of the multi-level switching circuit 521 of FIG. 9C.

As shown in FIG. 9D, the multi-level switching circuit 531 includes an MLS DC-to-DC converter 532, a first MLS modulator 533a, a second MLS modulator 533b, a first control circuit 534a, and a second control circuit 534b. The MLS DC-to-DC converter 532 receives a battery voltage $V_{BATT}$ and generates multiple regulated voltages (corresponding to a first regulated voltage $V_{MLS1}$, a second regulated voltage $V_{MLS2}$, and a third regulated voltage $V_{MLS3}$, in this example) for the first MLS modulator 533a and the second MLS modulator 533b. Although an example with the MLS DC-to-DC converter 532 generating three regulated voltages for the modulators is shown, the MLS DC-to-DC converter 532 can generate more or fewer regulated voltages for the modulators. The MLS DC-to-DC converter 532 also generates the first regulated voltage $V_{REG1}$ for the first AC combiner 54a and the second regulated voltage $V_{REG2}$ for the second AC combiner 54b, in this example.

With continuing reference to FIG. 9D, the first control circuit 534a processes a first sense signal SENSE1 from the first error amplifier 53a to generate control signals for the first MLS modulator 533a. The first MLS modulator 533a processes the control signals and the MLS regulated voltages to generate the first error amplifier supply voltage $V_{DD\_MLS1}$ for the first error amplifier 53a. Additionally, the second control circuit 534b processes a second sense signal SENSE2 from the second error amplifier 53b to generate control signals for the second MLS modulator 533b. The second MLS modulator 533b processes the control signals and the MLS regulated voltages to generate the second error amplifier supply voltage $V_{DD\_MLS2}$ for the second error amplifier 53b.

Figure 10:
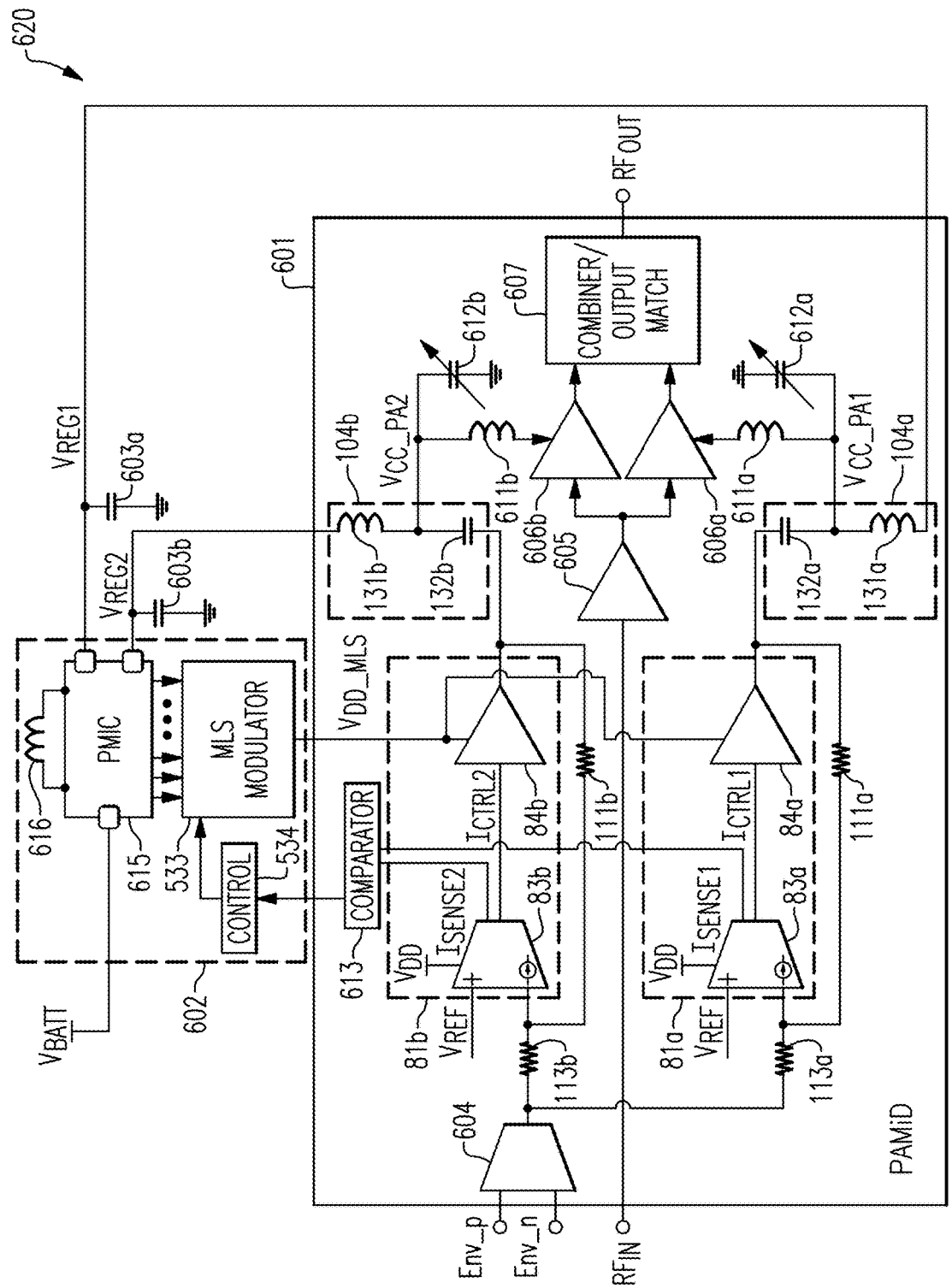
FIG. 10 is a schematic diagram of another embodiment of an envelope tracking system for multiple power amplifiers.

FIG. 10 is a schematic diagram of another embodiment of an envelope tracking system 620 for multiple power amplifiers. The envelope tracking system 620 includes a power amplifier module including duplexer (PAMiD) 601, a multi-level switching circuit 602, a first decoupling capacitor 603a, and a second decoupling capacitor 603b.

In the illustrated embodiment, the PAMiD 601 includes a first error amplifier 81a, a second error amplifier 81b, a first feedback resistor 111a, a second feedback resistor 111b, a first input resistor 113a, a second input resistor 113b, a first AC combiner 104a, a second AC combiner 104b, a differential envelope amplifier 604, a common power amplifier input stage 605, a first power amplifier output stage 606a, a second power amplifier output stage 606b, a combiner/output match circuit 607, a first choke inductor 611a, a second choke inductor 611b, a first bandwidth adjustment capacitor 612a, a second bandwidth adjustment capacitor 612b, and a current comparator 613.

Thus, various circuitry including AC combiners, error amplifiers, and power amplifiers are integrated on PAMiD. Any of the embodiments herein can include one or more AC combiners, one or more error amplifiers, and/or other circuitry integrated with one or more power amplifiers on a PAMiD.

With continuing reference to FIG. 10, the multi-level switching circuit 602 includes an MLS modulator 533, a control circuit 534, a power management integrated circuit (PMIC) 615, and a regulator inductor 616.

The PMIC 615 receives a battery voltage $V_{BATT}$ and generates a first regulated voltage $V_{REG1}$ for the first AC combiner 104a and a second regulated voltage $V_{REG2}$ for the second AC combiner 104b. The PMIC 615 also generates multiple regulated voltages (four, in this example) for the MLS modulator 533. The PMIC 615 includes an inductor-based switched-mode DC-to-DC converter (for instance, a buck-boost converter), which generates the regulated voltages based on controlling the current through the regulator inductor 616. The first decoupling capacitor 603a is connected between the first regulated voltage $V_{REG1}$ and ground, while the second decoupling capacitor 603b is connected between the second regulated voltage $V_{REG2}$ and ground.

In the illustrated embodiment, the power amplifier input stage 605 amplifies an RF input signal $RF_{IN}$ to generate an amplified RF signal for the first power amplifier output stage 606a and the second power amplifier output stage 606b. The signal outputs of the first power amplifier output stage 606a and the second power amplifier output stage 606b are combined using the combiner/output match circuit 607 to generate an RF output signal $RF_{OUT}$. The first power amplifier output stage 606a is powered by a first power amplifier supply voltage $V_{CC\_PA1}$ received from the first AC combiner 104a by way of the first choke inductor 611a, while the second power amplifier output stage 606b is powered a second power amplifier supply voltage $V_{CC\_PA2}$ received from the second AC combiner 104b by way of the second choke inductor 611b.

As shown in FIG. 10 the first AC combiner 104a includes a first inductor 131a and a first AC coupling capacitor 132a. Additionally, the second AC combiner 104b includes a second inductor 131b and a second AC coupling capacitor 132b.

In the illustrated embodiment, the first bandwidth adjustment capacitor 612a is electrically connected between the first power amplifier supply voltage $V_{CC\_PA1}$ and a ground voltage. Additionally, the second bandwidth adjustment capacitor 612b is electrically connected between the second power amplifier supply voltage $V_{CC\_PA2}$ and the ground voltage.

The first bandwidth adjustment capacitor 612a and the second bandwidth adjustment capacitor 612b each have a capacitance value that is controllable. For example, each bandwidth adjustment capacitor can include a bank of digitally-selectable capacitors, an analog-tuned capacitive element, and/or any other controllable capacitor structure. By including the bandwidth adjustment capacitors, flexibility is provided for adjusting a modulation bandwidth of the envelope tracking system 620.

The differential envelope amplifier 604 receives a differential envelope signal corresponding to a difference between a non-inverted envelope signal component ENV_p and an inverted envelope signal component ENV_n. Additionally, the differential envelope amplifier 604 provides a single-ended envelope signal to the first error amplifier 81a and the second error amplifier 81b by way of the first input resistor 113a and second input resistor 113b, respectively. The first error amplifier 81a and the second error amplifier 81b compare the single-ended envelope signal to a reference voltage $V_{REF}$, in this example.

In the illustrated embodiment, the first error amplifier 81a includes a first transconductance input stage 83a and a first output stage 84a. The first transconductance input stage 83a is powered by a supply voltage $V_{DD}$, while the first output stage 84a is powered by an error amplifier supply voltage $V_{DD\_MLS}$ from the MLS modulator 533. The first transconductance input stage 83a generates a first control current $I_{CTRL1}$ for the first output stage 84a, and a first sense current $I_{SENSE1}$. The second error amplifier 81b includes a second transconductance input stage 83b and a second output stage 84b. The second transconductance input stage 83b is powered by the supply voltage $V_{DD}$, while the second output stage 84b is powered by the error amplifier supply voltage $V_{DD\_MLS}$. The second transconductance input stage 83b generates a second control current $I_{CTRL2}$ for the second output stage 84b, and a second sense current $I_{SENSE2}$.

The comparator 613 processes the first sense current $I_{SENSE1}$ and the second sense current $I_{SENSE2}$ to generate a comparison signal for the control circuit 534. In certain implementations, the comparator 613 compares the first sense current $I_{SENSE1}$ and/or the second sense current $I_{SENSE2}$ to a reference current. The control circuit 534 processes the comparison signal to control the MLS modulator 533.

Figure 11A:
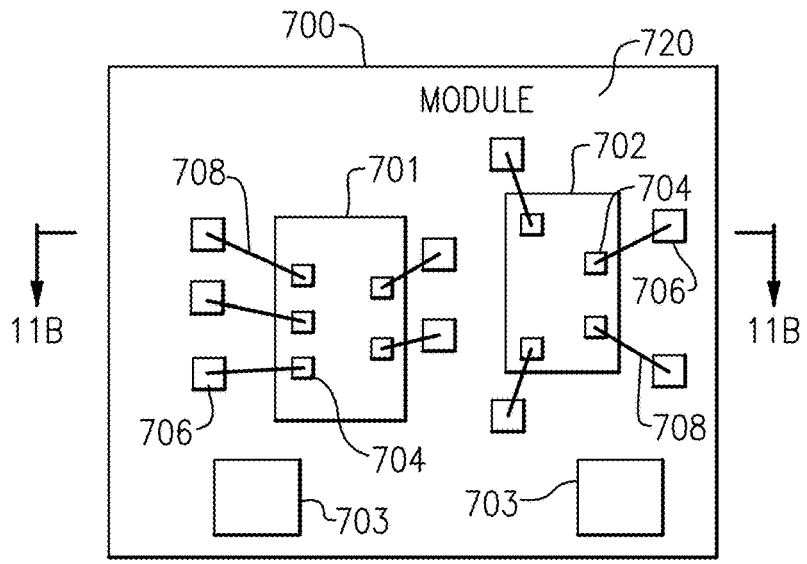
FIG. 11A is a schematic diagram of one embodiment of a packaged module.
Figure 11B:
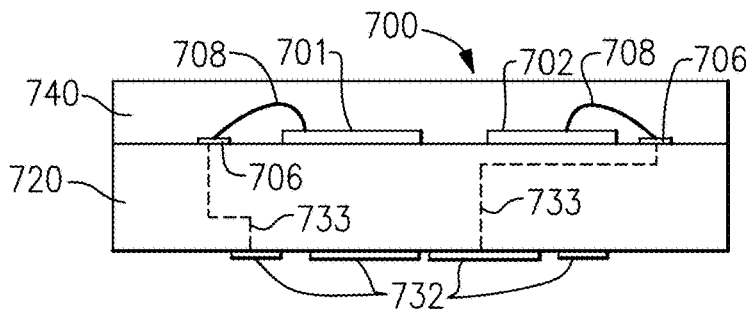
FIG. 11B is a schematic diagram of a cross-section of the packaged module of FIG. 11A taken along the lines 11B-11B.

FIG. 11A is a schematic diagram of one embodiment of a packaged module 700. FIG. 11B is a schematic diagram of a cross-section of the packaged module 700 of FIG. 11A taken along the lines 11B-11B. The packaged module 700 illustrates an example of a module that can include circuitry implemented in accordance with one or more features of the present disclosure.

The packaged module 700 includes a first die 701, a second die 702, surface mount components 703, wirebonds 708, a package substrate 720, and encapsulation structure 740. The package substrate 720 includes pads 706 formed from conductors disposed therein. Additionally, the dies 701, 702 include pads 704, and the wirebonds 708 have been used to connect the pads 704 of the dies 701, 702 to the pads 706 of the package substrate 720.

In certain implementations, the dies 701, 702 are manufactured using different processing technologies. In one example, the first die 701 is manufactured using a compound semiconductor process, and the second die 702 is manufactured using a silicon process. Although an example with two dies is shown, a packaged module can include more or fewer dies.

The packaging substrate 720 can be configured to receive a plurality of components such as the dies 701, 702 and the surface mount components 703, which can include, for example, surface mount capacitors and/or inductors.

As shown in FIG. 11B, the packaged module 700 is shown to include a plurality of contact pads 732 disposed on the side of the packaged module 700 opposite the side used to mount the dies 701, 702. Configuring the packaged module 700 in this manner can aid in connecting the packaged module 700 to a circuit board such as a phone board of a wireless device. The example contact pads 732 can be configured to provide RF signals, bias signals, ground, and/or supply voltage(s) to the dies 701, 702 and/or the surface mount components 703. As shown in FIG. 11B, the electrically connections between the contact pads 732 and the dies 701, 702 can be facilitated by connections 733 through the package substrate 720. The connections 733 can represent electrical paths formed through the package substrate 720, such as connections associated with vias and conductors of a multilayer laminated package substrate.

In some embodiments, the packaged module 700 can also include one or more packaging structures to, for example, provide protection and/or facilitate handling of the packaged module 700. Such a packaging structure can include overmold or encapsulation structure 740 formed over the packaging substrate 720 and the components and die(s) disposed thereon.

It will be understood that although the packaged module 700 is described in the context of electrical connections based on wirebonds, one or more features of the present disclosure can also be implemented in other packaging configurations, including, for example, flip-chip configurations.

Figure 12:
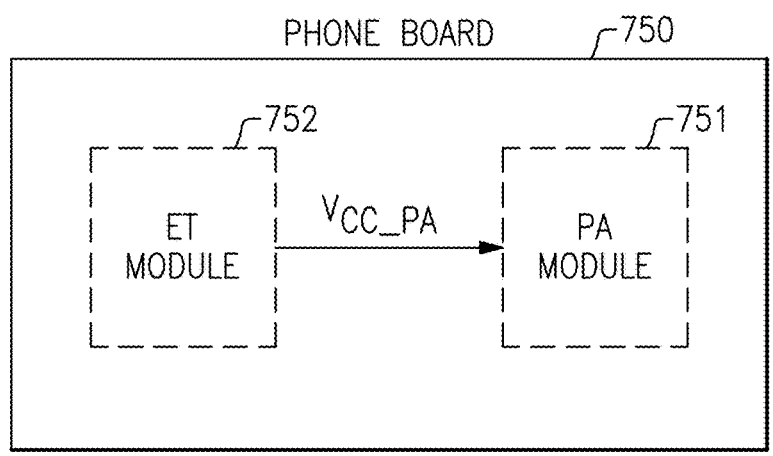
FIG. 12 is a schematic diagram of one embodiment of a phone board.

FIG. 12 is a schematic diagram of one embodiment of a phone board 750. The phone board 750 includes an envelope tracking module 752 and a power amplifier module 751 attached thereto. In certain configurations, the power amplifier module 751 and/or the envelope tracking module 752 are implemented using a module similar to that of the module 700 shown in FIGS. 11A-11B. As shown in FIG. 12, the envelope tracking module 752 provides a power amplifier supply voltage $V_{CC\_PA}$ to the power amplifier module 751. Additionally, the envelope tracking module 752 controls the power amplifier supply voltage $V_{CC\_PA}$ to change in relation to the envelope of an RF signal amplified by the power amplifier module 751.

Although not illustrated in FIG. 12 for clarity, the phone board 750 typically includes additional components and structures.

Figure 13:
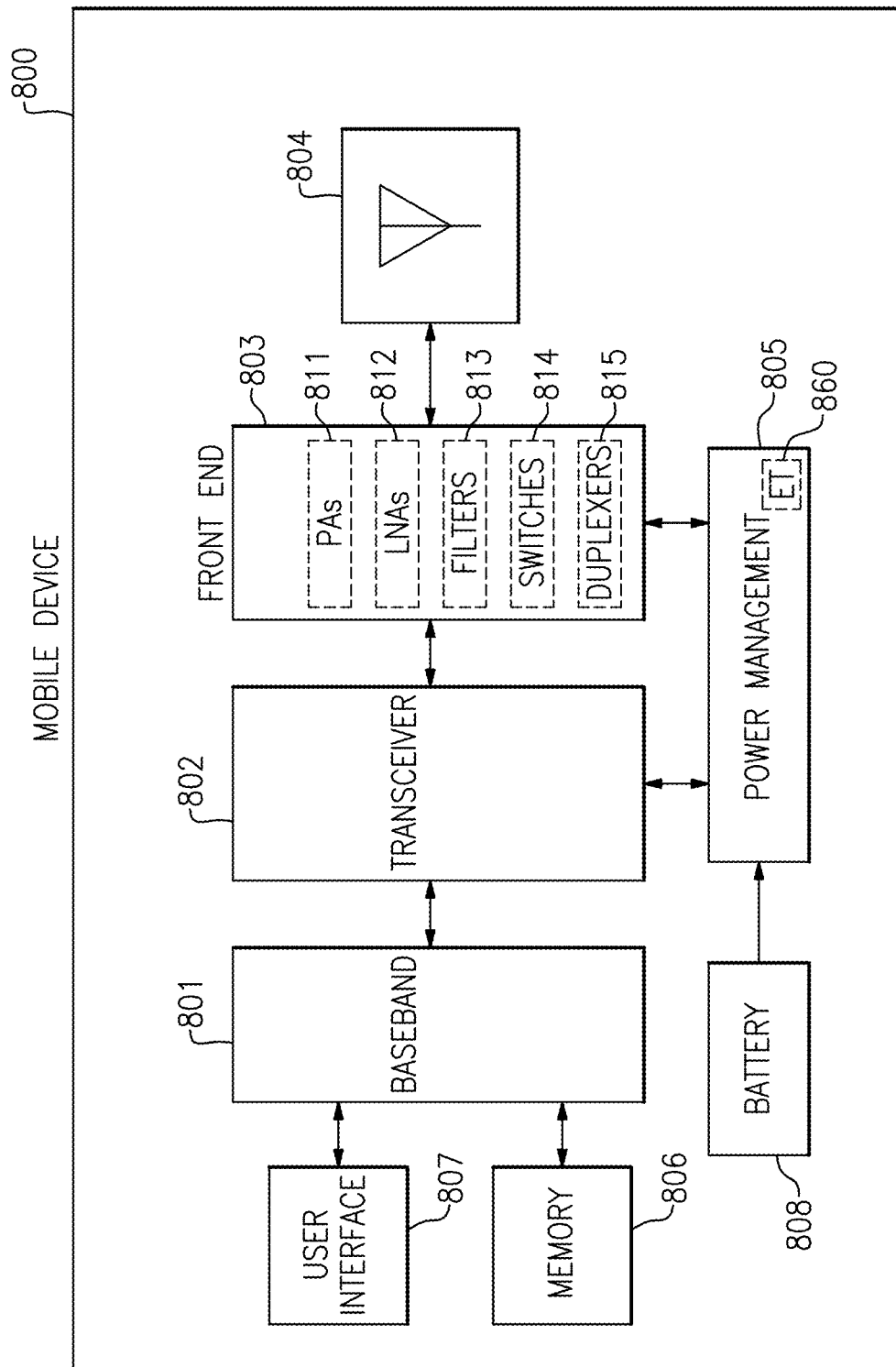
FIG. 13 is a schematic diagram of one embodiment of a mobile device.

FIG. 13 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 13 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 13, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. The power management system 805 can include an envelope tracker 860 implemented in accordance with one or more features of the present disclosure.

As shown in FIG. 13, the power management system 805 receives a battery voltage form the battery 808. The battery 808 can be any suitable battery for use in the mobile device 800, including, for example, a lithium-ion battery.

Figure 14:
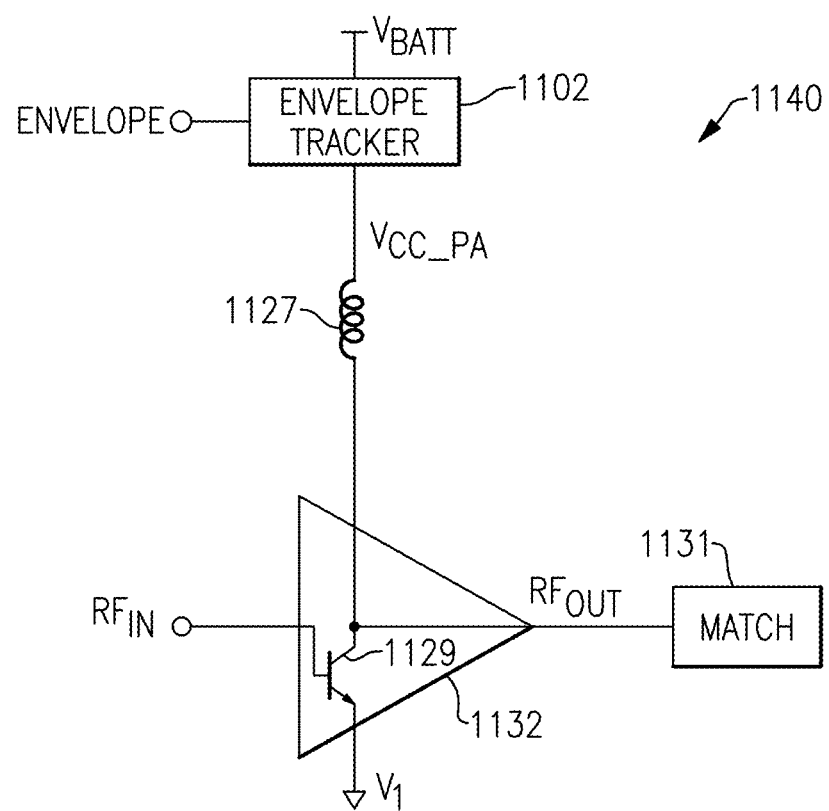
FIG. 14 is a schematic diagram of one example of a power amplifier system including an envelope tracker.

FIG. 14 is a schematic diagram of one example of a power amplifier system 1140 including an envelope tracker 1102. The illustrated power amplifier system 1140 further includes an inductor 1127, an output impedance matching circuit 1131, and a power amplifier 1132. The illustrated envelope tracker 1102 receives a battery voltage $V_{BATT}$ and an envelope of the RF signal and generates a power amplifier supply voltage $V_{CC\_PA}$ for the power amplifier 1132.

The illustrated power amplifier 1132 includes a bipolar transistor 1129 having an emitter, a base, and a collector. As shown in FIG. 14, the emitter of the bipolar transistor 1129 is electrically connected to a power low supply voltage Vi, which can be, for example, a ground supply. Additionally, an RF signal ($RF_{IN}$) is provided to the base of the bipolar transistor 1129, and the bipolar transistor 1129 amplifies the RF signal to generate an amplified RF signal at the collector. The bipolar transistor 1129 can be any suitable device. In one implementation, the bipolar transistor 1129 is a heterojunction bipolar transistor (HBT).

The output impedance matching circuit 1131 serves to terminate the output of the power amplifier 1132, which can aid in increasing power transfer and/or reducing reflections of the amplified RF signal generated by the power amplifier 1132. In certain implementations, the output impedance matching circuit 1131 further operates to provide harmonic termination and/or to control a load line impedance of the power amplifier 1132.

The inductor 1127 can be included to provide the power amplifier 1132 with the power amplifier supply voltage $V_{CC\_PA}$ generated by the envelope tracker 1102 while choking or blocking high frequency RF signal components. The inductor 1127 can include a first end electrically connected to the envelope tracker 1102, and a second end electrically connected to the collector of the bipolar transistor 1129. In certain implementations, the inductor 1127 operates in combination with the impedance matching circuit 1131 to provide output matching.

Although FIG. 14 illustrates one implementation of the power amplifier 1132, skilled artisans will appreciate that the teachings described herein can be applied to a variety of power amplifier structures, such as multi-stage power amplifiers and power amplifiers employing other transistor structures. For example, in some implementations the bipolar transistor 1129 can be omitted in favor of employing a field effect transistor (FET), such as a silicon FET, a gallium arsenide (GaAs) high electron mobility transistor (HEMT), or a laterally diffused metal oxide semiconductor (LDMOS) transistor. Additionally, the power amplifier 1132 can be adapted to include additional circuitry, such as biasing circuitry.

Figure 15:
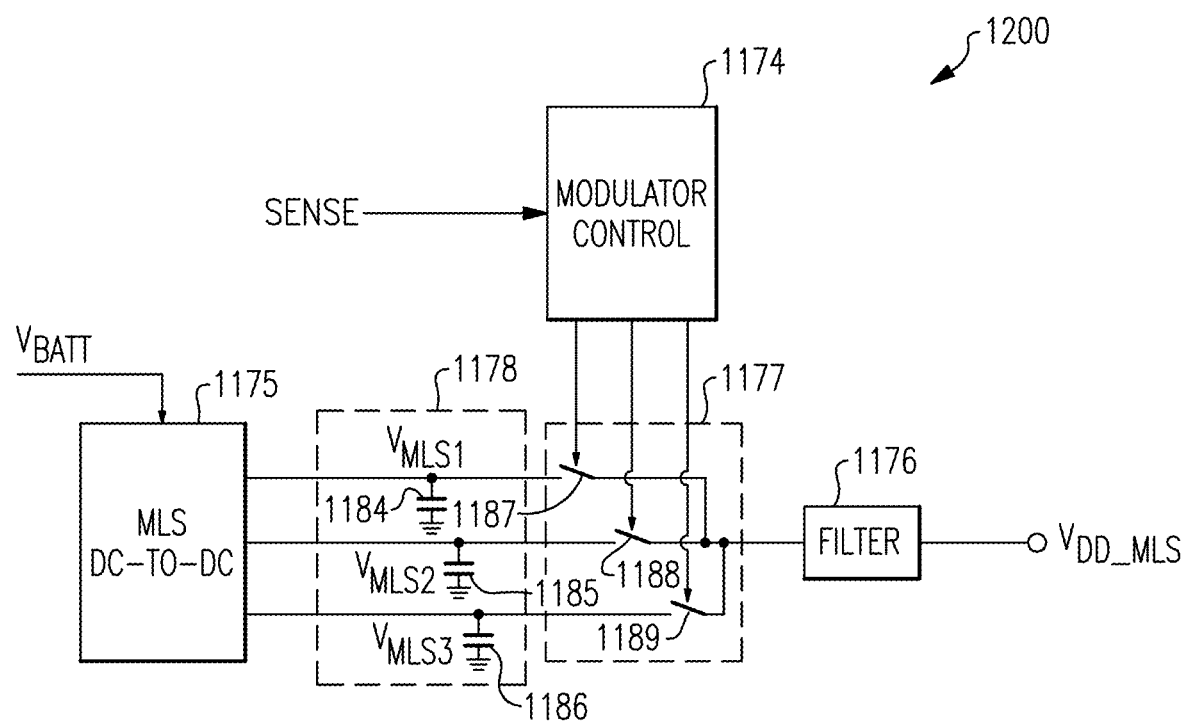
FIG. 15 is a schematic diagram of one embodiment of a multi-level switching circuit according to one embodiment.

FIG. 15 is a schematic diagram of one embodiment of a multi-level switching circuit 1200 according to one embodiment. The multi-level switching circuit 1200 includes a modulator control circuit 1174, an MLS DC-to-DC converter 1175, a modulator output filter 1176, a modulator switch bank 1177, and a decoupling capacitor bank 1178.

Although one embodiment of a multi-level switching circuit is shown, the teachings herein are applicable to multi-level switching circuits implemented in a wide variety of ways.

As shown in FIG. 15, the decoupling capacitor bank 1178 includes a first capacitor 1184, a second capacitor 1185, and a third capacitor 1186. Additionally, the modulator switch bank 1177 includes a first switch 1187, a second switch 1188, and a third switch 1189. Although three decoupling capacitors and three switches are shown, more or fewer decoupling capacitors and/or more or fewer switches can be included.

In the illustrated embodiment, the MLS DC-to-DC converter 1175 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. While illustrated as outputting three regulated voltages, the MLS DC-to-DC converter 1175 can generate more or fewer regulated voltages. In certain implementations, one or more of the regulated voltages are boosted voltages having a voltage level greater than the voltage level of the battery voltage $V_{BATT}$.

The decoupling capacitor bank 1178 stabilizes the regulated voltages generated by the MLS DC-to-DC converter 1175. For example, the first decoupling capacitor 1184 provides decoupling to the first regulated voltage $V_{MLS1}$, the second decoupling capacitor 1185 provides decoupling for second regulated voltage $V_{MLS2}$, and the third decoupling capacitor 1186 provides decoupling for the third regulated voltage $V_{MLS3}$.

The modulator control circuit 1174 processes a sense signal SENSE to select particular switches of the modulator switch bank 1177. In certain implementations, the modulator control circuit 1174 provides at least one of coding or dithering when controlling the modulator switch bank 1177 to compensate for artifacts arising from opening and closing the switches.

The filter 1176 filters the output of the modulator switch bank 1177 to generate the error amplifier supply voltage $V_{DD\_MLS}$.

Figure 16A:
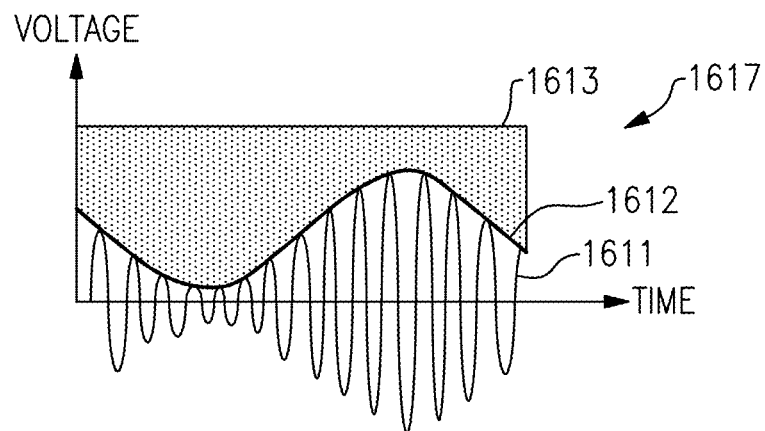
FIG. 16A is a graph showing a first example of power amplifier supply voltage versus time.

FIG. 16A is a graph 1617 showing a first example of power amplifier supply voltage versus time. The graph 1617 illustrates the voltage of an RF signal 1611, the RF signal's envelope 1612, and a power amplifier supply voltage 1613 versus time. The graph 1617 corresponds to one example of waveforms for an implementation in which the power amplifier supply voltage 1613 is substantially fixed.

It can be important that the power amplifier supply voltage 1613 of a power amplifier has a voltage greater than that of the RF signal 1611. For example, powering a power amplifier using a power amplifier supply voltage that has a magnitude less than that of the RF signal can clip the RF signal, thereby creating signal distortion and/or other problems. Thus, it can be important the power amplifier supply voltage 1613 be greater than that of the envelope 1612. However, it can be desirable to reduce a difference in voltage between the power amplifier supply voltage 1613 and the envelope 1612 of the RF signal 1611, as the area between the power amplifier supply voltage 1613 and the envelope 1612 can represent lost energy, which can reduce battery life and increase heat generated in a wireless device.

Figure 16B:
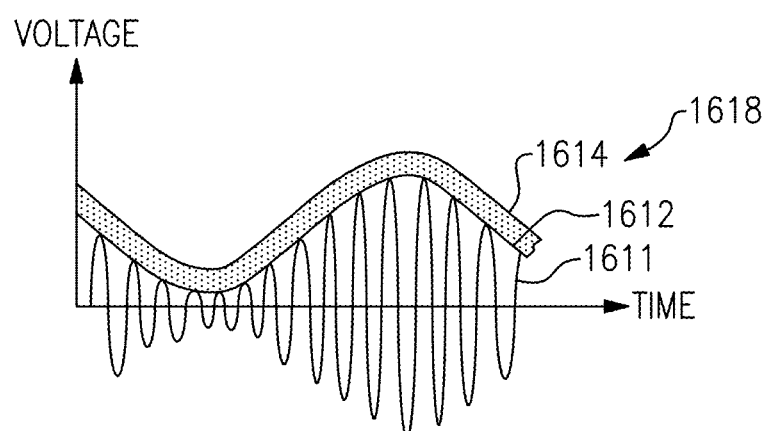
FIG. 16B is a graph showing a second example of power amplifier supply voltage versus time.

FIG. 16B is a graph 1618 showing a second example of power amplifier supply voltage versus time. The graph 1618 illustrates the voltage of an RF signal 1611, the RF signal's envelope 1612, and a power amplifier supply voltage 1614 versus time. The graph 1618 corresponds to one example of waveforms for an implementation in which the power amplifier supply voltage 1614 is generated by envelope tracking.

In contrast to the power amplifier supply voltage 1613 of FIG. 16A, the power amplifier supply voltage 1614 of FIG. 16B changes in relation to the envelope 1612 of the RF signal 1611. The area between the power amplifier supply voltage 1614 and the envelope 1612 in FIG. 16B is less than the area between the power amplifier supply voltage 1613 and the envelope 1612 in FIG. 16A, and thus the graph 1618 of FIG. 16B can be associated with an envelope tracking system having greater energy efficiency.

Figure 17:
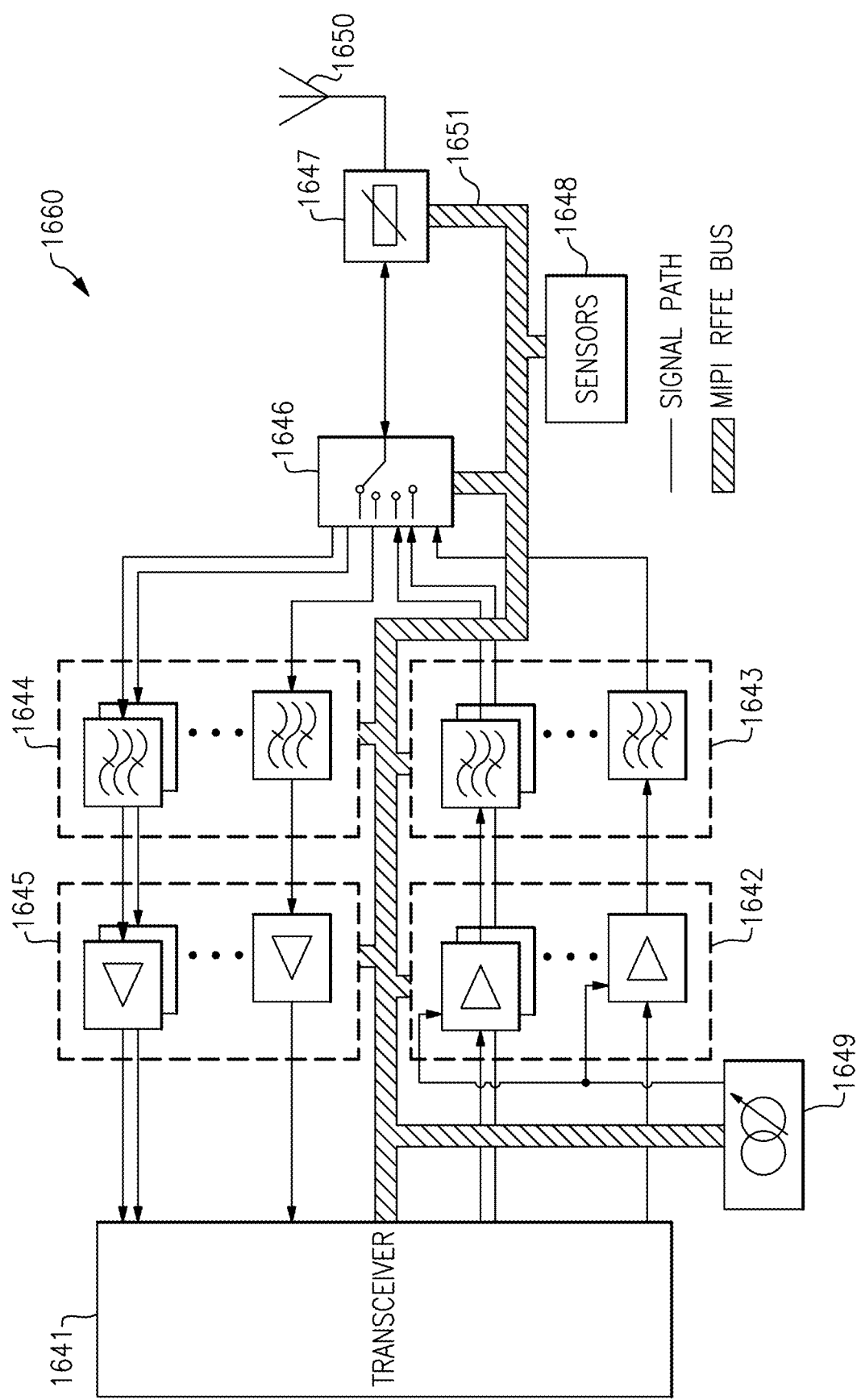
FIG. 17 is a schematic diagram of another embodiment of a communication system.

FIG. 17 is a schematic diagram of another embodiment of a communication system 1660. The communication system 1660 further includes a transceiver 1641, a power amplifier module 1642, a transmit filter module 1643, a receive filter module 1644, a low noise amplifier (LNA) module 1645, an antenna switch module 1646, a coupler module 1647, a sensor module 1648, a power management module 1649, an antenna 1650, and a MIPI RFFE bus 1651.

As shown in FIG. 17, various components of the communication system 1660 are interconnected by the MIPI RFFE bus 1651. Additionally, the transceiver 1641 includes a master device of the MIPI RFFE bus 1651, and each of the RF components includes a slave device of the MIPI RFFE bus 1651. The master device of the transceiver 1641 sends control commands over the MIPI RFFE bus 1651 to configure the communication system 1660 during initialization and/or while operational.

The power amplifier module 1642 can include one or more power amplifiers. As shown in FIG. 17, the power amplifier module 1642 receives one or more power amplifier supply voltages from the power management module 1649. The power management module 1649 can include an envelope tracker that generates at least one power amplifier supply voltage, and that is implemented in accordance with the teachings herein.

Although FIG. 17 illustrates one example of a communication system including a power management module and a power amplifier module, the teachings herein are applicable to communication systems implemented in a wide variety of ways.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An envelope tracking system comprising:
    a first power amplifier configured to amplify a first radio frequency signal;
    a second power amplifier configured to amplify a second radio frequency signal; and
    an envelope tracker configured to generate a first power amplifier supply voltage of the first power amplifier and a second power amplifier supply voltage of the second power amplifier, the envelope tracker including a first error amplifier configured to generate a first output current that adjusts the first power amplifier supply voltage, a second error amplifier configured to output a second output current that adjusts the second power amplifier supply voltage, and a multi-level switching circuit configured to control a first error amplifier supply voltage of the first error amplifier based on a first sense signal from the first error amplifier and to control a second error amplifier supply voltage of the second error amplifier based on a second sense signal from the second error amplifier, the first error amplifier configured to amplify a difference between a reference signal and a first envelope signal indicating an envelope of the first radio frequency signal.

2. The envelope tracking system of claim 1 wherein the first error amplifier includes an output stage powered by the first error amplifier supply voltage.

3. The envelope tracking system of claim 2 wherein the first error amplifier further includes an input stage powered by a fixed supply voltage.

4. The envelope tracking system of claim 2 wherein the first error amplifier further includes an input stage configured to output a first sense current corresponding to the first sense signal.

5. The envelope tracking system of claim 4 wherein the multi-level switching circuit includes a control circuit configured to compare the first sense current to a plurality of current thresholds of different levels.

6. The envelope tracking system of claim 5 wherein the control circuit includes a hysteretic current comparator.

7. The envelope tracking system of claim 1 wherein the second error amplifier is configured to amplify a difference between the reference signal and a second envelope signal indicating an envelope of the second radio frequency signal.

8. The envelope tracking system of claim 7 wherein the multi-level switching circuit includes a multi-level supply DC-to-DC converter configured to generate a plurality of regulated voltages of different voltage levels, a first modulator configured to receive the plurality of regulated voltages and to output the first error amplifier supply voltage, and a second modulator configured to receive the plurality of regulated voltages and to output the second error amplifier supply voltage.

9. The envelope tracking system of claim 1 wherein the multi-level switching circuit includes a switched capacitor DC-to-DC converter configured to generate a plurality of regulated voltages of different voltage levels, a first modulator configured to receive the plurality of regulated voltages and to output the first error amplifier supply voltage, and a second modulator configured to receive the plurality of regulated voltages and to output the second error amplifier supply voltage.

10. A method of envelope tracking, the method comprising:
    amplifying a first radio frequency signal using a first power amplifier;
    amplifying a second radio frequency using a second power amplifier;
    adjusting a first power amplifier supply voltage of the first power amplifier using a first error amplifier, including combining a first DC voltage and an output current of the first error amplifier using a first combiner;
    controlling a first error amplifier supply voltage of the first error amplifier based on a first sense signal from the first error amplifier using a multi-level switching circuit;
    adjusting a second power amplifier supply voltage of the second power amplifier using a second error amplifier, including combining a second DC voltage and an output current of the second error amplifier using a second combiner;
    controlling a second error amplifier supply voltage of the second error amplifier based on a second sense signal from the second error amplifier using the multi-level switching circuit.

11. The method of claim 10 further comprising powering an output stage of the first error amplifier with the first error amplifier supply voltage.

12. The method of claim 11 further comprising powering an input stage of the first error amplifier using a fixed supply voltage.

13. The method of claim 11 further comprising generating a first sense current corresponding to the first sense signal using an input stage of the first error amplifier, and controlling the multi-level switching circuit based on comparing the first sense current to a plurality of current thresholds of different levels.

14. The method of claim 10 further comprising generating the first DC voltage and the second DC voltage using a multi-output DC-to-DC converter.

15. A mobile device comprising:
    a transceiver configured to generate a first radio frequency signal and a second radio frequency signal;
    a front end circuit including a first power amplifier configured to amplify the first radio frequency signal and a second power amplifier configured to amplify the second radio frequency signal; and
    a power management circuit including an envelope tracker configured to generate a first power amplifier supply voltage of the first power amplifier and a second power amplifier supply voltage of the second power amplifier, the envelope tracker including a first error amplifier configured to generate a first output current that adjusts the first power amplifier supply voltage, a second error amplifier configured to output a second output current that adjusts the second power amplifier supply voltage, and a multi-level switching circuit configured to control a first error amplifier supply voltage of the first error amplifier based on a first sense signal from the first error amplifier and to control a second error amplifier supply voltage of the second error amplifier based on a second sense signal from the second error amplifier, the multi-level switching circuit including a multi-level supply DC-to-DC converter configured to generate a plurality of regulated voltages of different voltage levels, a first modulator configured to receive the plurality of regulated voltages and to output the first error amplifier supply voltage, and a second modulator configured to receive the plurality of regulated voltages and to output the second error amplifier supply voltage.

16. The mobile device of claim 15 wherein the first error amplifier includes an output stage powered by the first error amplifier supply voltage.

17. The mobile device of claim 16 wherein the first error amplifier further includes an input stage powered by a fixed supply voltage.

18. The mobile device of claim 15 wherein the first error amplifier further includes an input stage configured to output a first sense current corresponding to the first sense signal.

19. The mobile device of claim 18 wherein the multi-level switching circuit includes a control circuit configured to compare the first sense current to a plurality of current thresholds of different levels.

20. The mobile device of claim 19 wherein the control circuit includes a hysteretic current comparator.

* * * * *